US011377733B2

(12) United States Patent
Zhou et al.

(10) Patent No.: US 11,377,733 B2
(45) Date of Patent: Jul. 5, 2022

(54) FLUORINE-FREE TUNGSTEN DEPOSITION PROCESS EMPLOYING IN-SITU OXIDATION AND APPARATUSES FOR EFFECTING THE SAME

(71) Applicant: SANDISK TECHNOLOGIES LLC, Addison, TX (US)

(72) Inventors: Fei Zhou, San Jose, CA (US); Raghuveer S. Makala, Campbell, CA (US); Rahul Sharangpani, Fremont, CA (US); Yusuke Mukae, Nagoya (JP); Naoki Takeguchi, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/987,717

(22) Filed: Aug. 7, 2020

(65) Prior Publication Data
US 2022/0042171 A1 Feb. 10, 2022

(51) Int. Cl.
C23C 16/08 (2006.01)
C23C 16/448 (2006.01)
C23C 16/455 (2006.01)
C23C 16/52 (2006.01)
C23C 16/02 (2006.01)

(52) U.S. Cl.
CPC ...... *C23C 16/4488* (2013.01); *C23C 16/0209* (2013.01); *C23C 16/08* (2013.01); *C23C 16/45517* (2013.01); *C23C 16/45565* (2013.01); *C23C 16/52* (2013.01)

(58) Field of Classification Search
CPC ... C23C 16/08; C23C 16/06; C23C 16/45517; C23C 16/45565; C23C 16/52
See application file for complete search history.

(56) References Cited

U.S. PATENT DOCUMENTS

| 5,855,689 | A  | * | 1/1999  | Akiyama | C23C 16/4405 134/1.1 |
| 6,194,295 | B1 | * | 2/2001  | Chang | C23C 16/14 257/E21.168 |
| 9,397,046 | B1 |   | 7/2016  | Sharangpani et al. | |
| 9,748,174 | B1 |   | 8/2017  | Amano | |
| 9,793,139 | B2 |   | 10/2017 | Sharangpani et al. | |
| 9,799,671 | B2 |   | 10/2017 | Pachamuthu et al. | |
| 10,229,931 | B1 |   | 3/2019 | Hinoue et al. | |
| 10,290,652 | B1 |   | 5/2019 | Sharangpani et al. | |
| 10,361,213 | B2 |   | 7/2019 | Sharangpani et al. | |
| 10,403,504 | B2 |   | 9/2019 | Longrie et al. | |
| 10,529,620 | B2 |   | 1/2020 | Sharangpani et al. | |
| 10,608,010 | B2 |   | 3/2020 | Terasawa et al. | |
| 10,714,385 | B2 | * | 7/2020 | Kovalgin | C23C 16/45536 |
| 2002/0172756 | A1 | * | 11/2002 | Joo | H01L 21/28247 438/585 |
| 2006/0186468 | A1 | * | 8/2006  | Hosoda | H01L 27/11546 257/341 |
| 2008/0254623 | A1 | * | 10/2008 | Chan | C23C 16/045 438/685 |
| 2009/0149022 | A1 | * | 6/2009  | Chan | C23C 16/0281 438/660 |
| 2010/0055904 | A1 | * | 3/2010  | Chen | H01L 21/76876 438/680 |
| 2010/0159694 | A1 | * | 6/2010  | Chandrashekar | C23C 16/14 438/660 |
| 2011/0003467 | A1 | * | 1/2011  | Kanda | H01L 21/02247 438/585 |
| 2011/0049599 | A1 | * | 3/2011  | Taketani | H01L 29/66818 257/302 |
| 2015/0050807 | A1 | * | 2/2015  | Wu | H01L 21/28556 438/669 |
| 2016/0104624 | A1 | * | 4/2016  | Fu | H01L 21/32053 438/674 |
| 2016/0300848 | A1 |   | 10/2016 | Pachamuthu et al. | |
| 2017/0125538 | A1 |   | 5/2017  | Sharangpani et al. | |
| 2017/0352669 | A1 |   | 12/2017 | Sharangpani et al. | |

(Continued)

FOREIGN PATENT DOCUMENTS

JP 2004-91813 * 3/2004 ............. C23C 16/06

OTHER PUBLICATIONS

Shang, D.S., et al., "Improvement of reproducible resistance switching in polycrystalline tungsten oxide films by in situ oxygen annealing". Applied Physics Letters 96, Jul. 21, 2003 (2010) pp. 1-3, doi: 10.1063/1.3300637.*
Moulzolf, Scott C, et al., "Stoichiometry and microstructure effects on tungsten oxide chemi resistive films". Sensors and Actuators B 77 (2001) 375-382.*
Kirss, Rein U., et al., "Chemical Vapor Deposition of Tungsten Oxide". Applied Organometallic Chemistry, vol. 12, 155-160 (1998).*
Semitracks Newsletter: Henderson, Christopher, "CVD Part II", Issue 73, Dec. 2015, pp. 1-12.*
Lai, Ken K., et al., "Tungsten chemical vapor deposition using tungsten hexacarbonyl: microstructure of as-deposited and annealed films". Thin Solid Films, vol. 370, Issues 1-2, Jul. 17, 2000, pp. 114-121.*
Broadbent, E.K., et al., "Selective Low Pressure Chemical Vapor Deposition of Tungsten". J. Electrochem. Soc. 1984, vol. 131, Issue 6, pp. 1427-1433.*

(Continued)

*Primary Examiner* — Bret P Chen
(74) *Attorney, Agent, or Firm* — The Marbury Law Group PLLC

(57) ABSTRACT

A method of depositing tungsten over a substrate includes disposing the substrate into a vacuum enclosure of a tungsten deposition apparatus, performing a first tungsten deposition process that deposits a first tungsten layer over a physically exposed surface of the substrate by flowing a fluorine-containing tungsten precursor gas into the vacuum enclosure, performing an in-situ oxidation process by exposing the first tungsten layer to an oxidation agent gas while the substrate remains within the vacuum enclosure without breaking vacuum and forming a tungsten oxyfluoride gas which is pumped out of the vacuum enclosure, and performing a second tungsten deposition process that deposits a second tungsten layer on the first tungsten layer by flowing the fluorine-containing tungsten precursor gas into the vacuum enclosure in a second tungsten deposition process after the in-situ oxidation process.

13 Claims, 27 Drawing Sheets

(56) References Cited

U.S. PATENT DOCUMENTS

| | | | |
|---|---|---|---|
| 2017/0373079 | A1 | 12/2017 | Sharangpani et al. |
| 2018/0033646 | A1* | 2/2018 | Sharangpani ..... H01L 27/11582 |
| 2018/0090373 | A1 | 3/2018 | Sharangpani et al. |
| 2018/0208617 | A1* | 7/2018 | Lee .................. C07F 11/00 |
| 2018/0301462 | A1* | 10/2018 | Matsubara ........ H01L 27/11546 |
| 2018/0342396 | A1* | 11/2018 | Wong .................... H01L 21/321 |
| 2019/0214230 | A1* | 7/2019 | Cui .................. H01L 21/32135 |
| 2019/0280001 | A1 | 9/2019 | Terasawa et al. |
| 2019/0287916 | A1 | 9/2019 | Sharangpani et al. |
| 2019/0287982 | A1 | 9/2019 | Hinoue et al. |
| 2020/0006131 | A1 | 1/2020 | Shimabukuro et al. |
| 2020/0111675 | A1* | 4/2020 | Takatsuki ............... C23C 16/18 |

OTHER PUBLICATIONS

Lee, Pei-Ing, et al., "Chemical Vapor Deposition of Tungsten (CVD W) as Submicron Interconnection and Via Stud". J. Electrochem. Soc., vol. 136, No. 7, Jul. 1989, pp. 2108-2112.*

Notification of Transmittal of the International Search Report and the Written Opinion of the International Searching Authority for International Patent Application No. PCTUS2021/034365, dated Jul. 29, 2021, 11 pages.

Klaus, J.W. et al., "Atomic layer deposition of tungsten using sequential surface chemistry with a sacrificial stripping reaction," Thin Solid Films, Feb. 1, 2000, vol. 360, Nos. 1-2, pp. 45-53. URL: < https://citeseerx.ist.psu.edu/viewdoc/download?doi=10.1.1.581.9232&rep=rep1&type=pdf >. Feb. 1, 2000 (Feb. 1, 2000).

Lei, W. et al., "Real-time observation and optimization of tungsten atomic layer deposition process cycle," Journal of Vacuum Science & Technology B: Microelectronics and Nanometer Structures Processing, Measurement, and Phenomena. Mar. 16, 2006; vol. 24, No. 2, pp. 780-789. Mar. 16, 2006 (Mar. 16, 2006); https://doi.org/10.1116/1.2184320.

McConica, C.M. et al., "The kinetics of LPCVD tungsten deposition in a single wafer reactor," Journal of the Electrochemical Society. Dec. 1, 1986; vol. 133, No. 12, pp. 2542-2548. Dec. 1, 1986 (Dec. 1, 1986); https://iopscience.iop.org/article/10.1149/1.2108468/pdf.

Sohal, R. et al., "Thermal oxidation of chemical vapour deposited tungsten layers on silicon substrates for embedded non-volatile memory application," Thin Solid Films, Jun. 30, 2009; vol. 517, No. 16, pp. 4534-4539. Retrieved from the Google Scholar. Jun. 30, 2009 (Jun. 30, 2009); https://doi.org/10.1016/j.tsf.2008.12.036.

Gu, Y. et al., "Management of Tungsten CVD Effluents," Electrochemical Society Proceedings, vol. 2001-6, pp. 177-182, (2001).

* cited by examiner

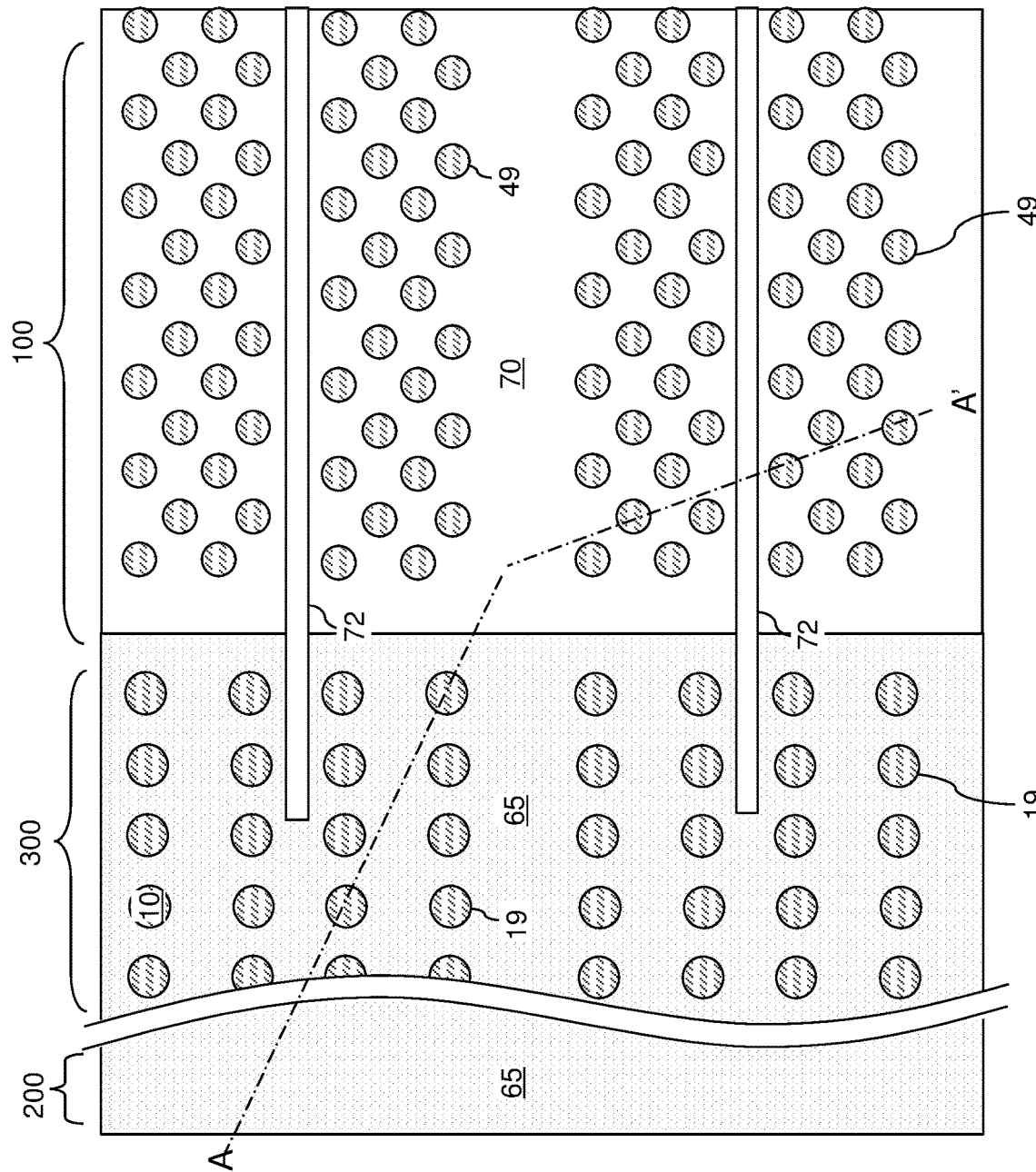

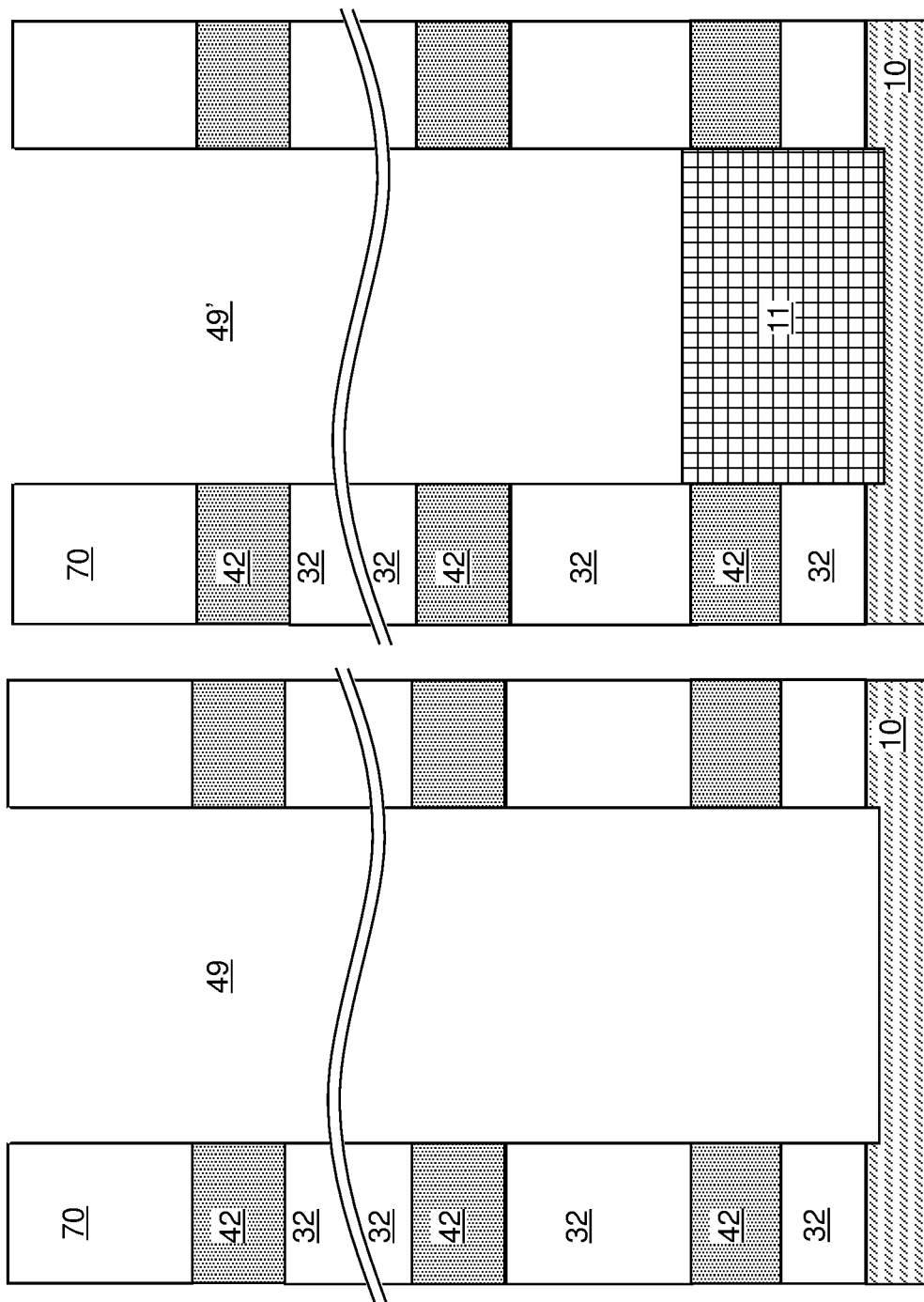

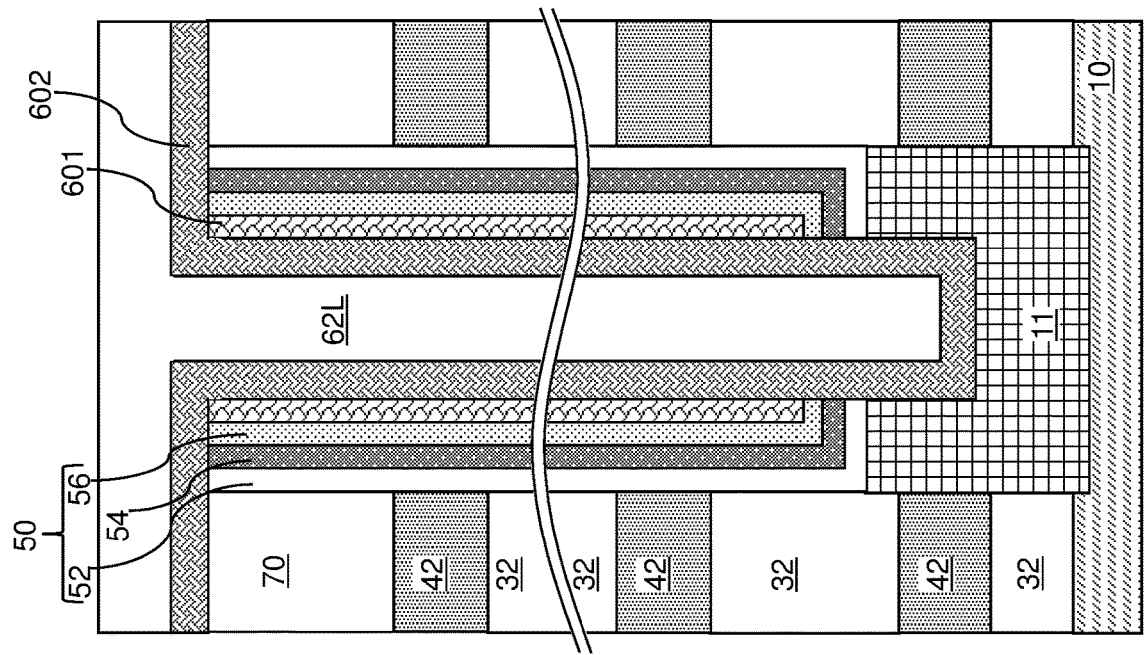
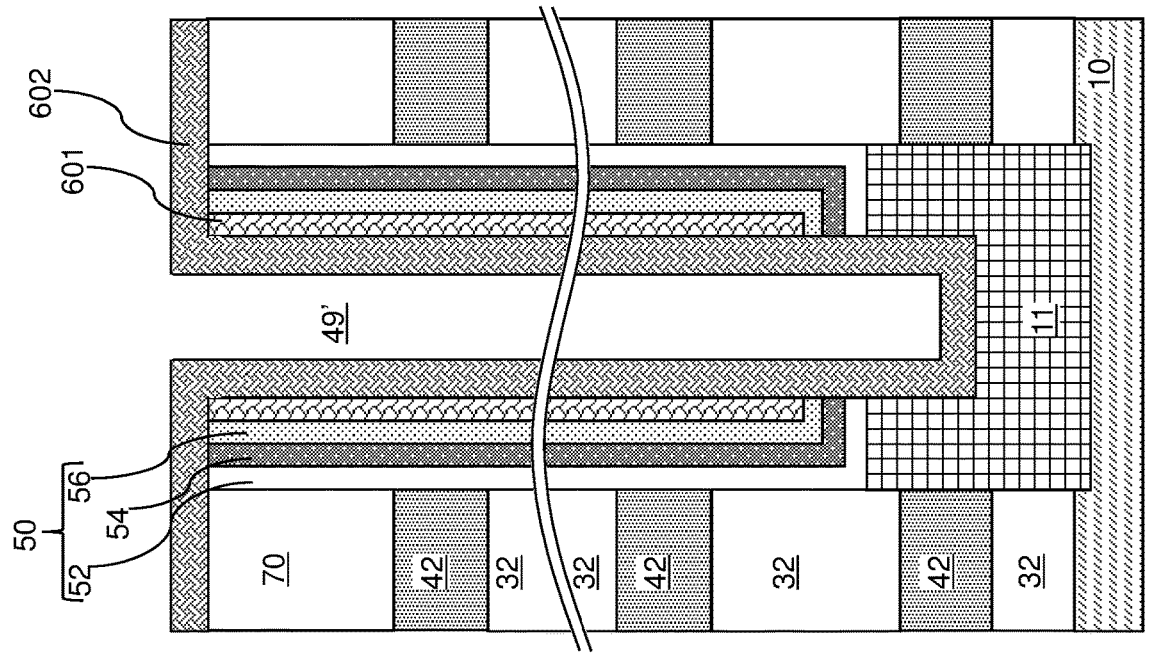

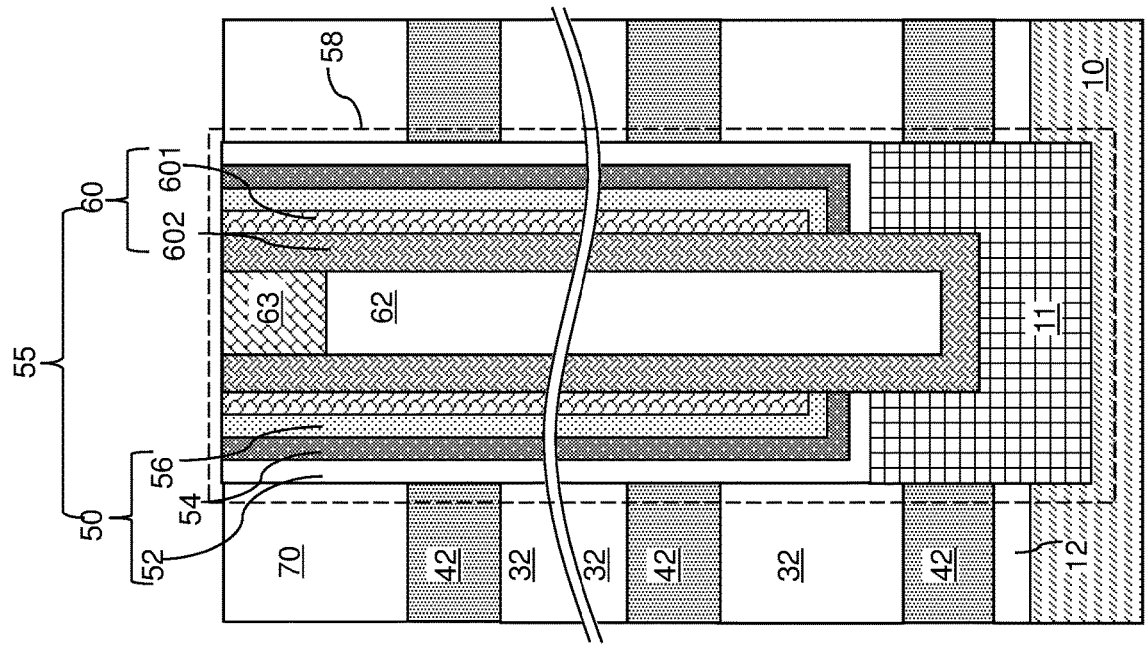
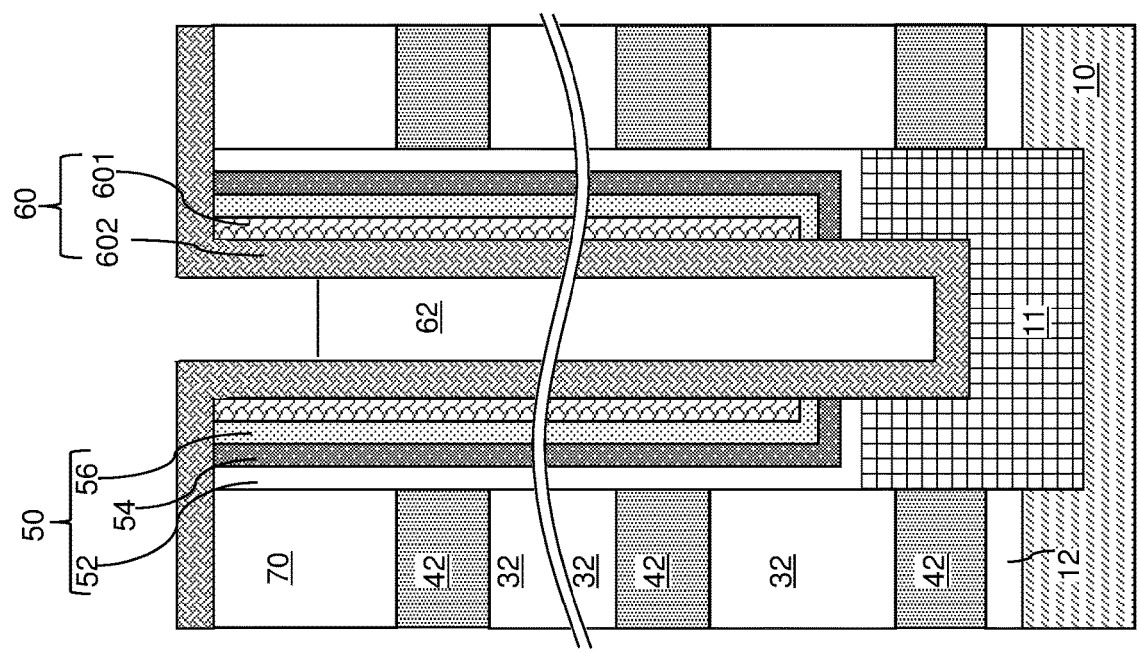
FIG. 5G
FIG. 5H

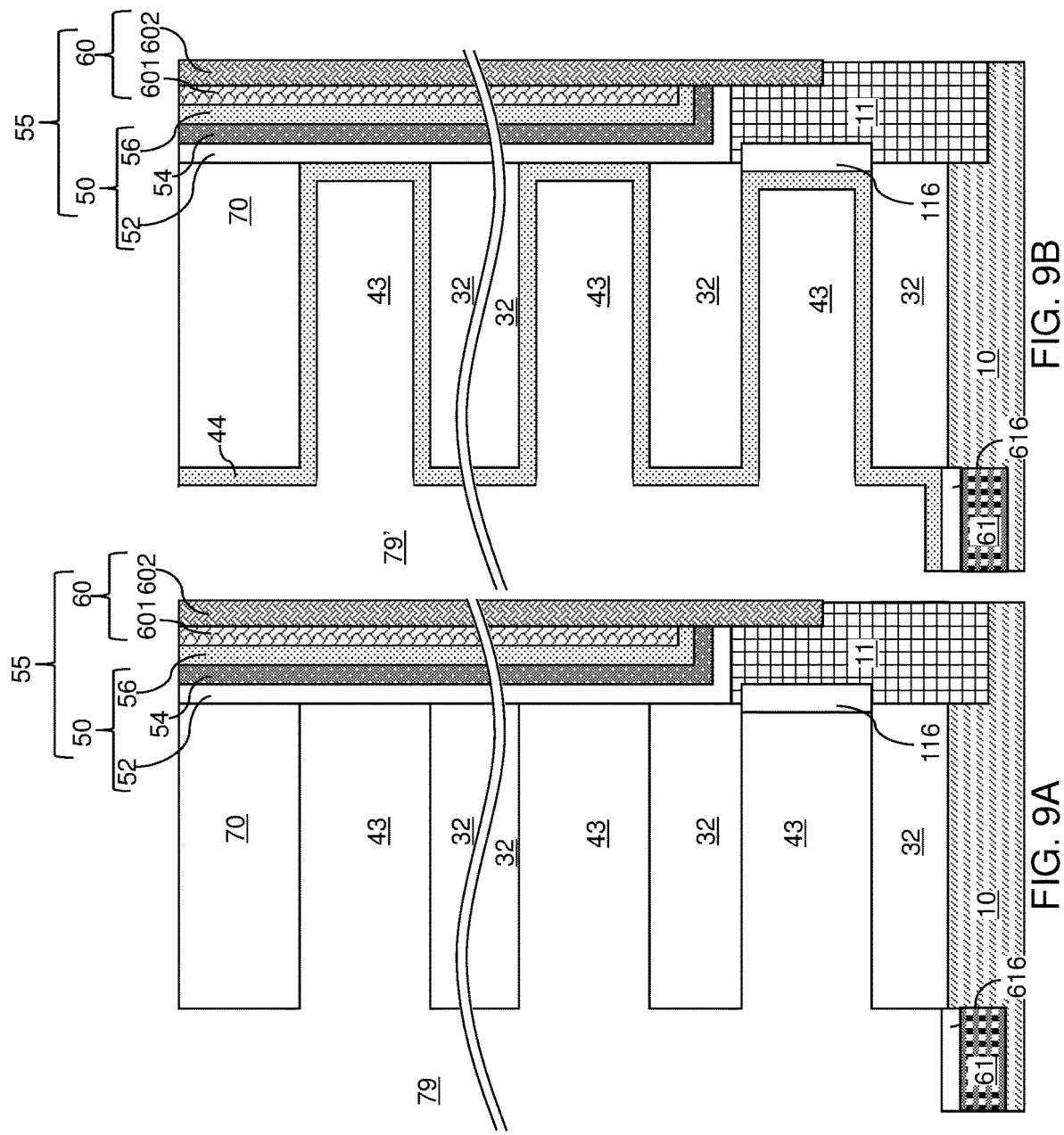

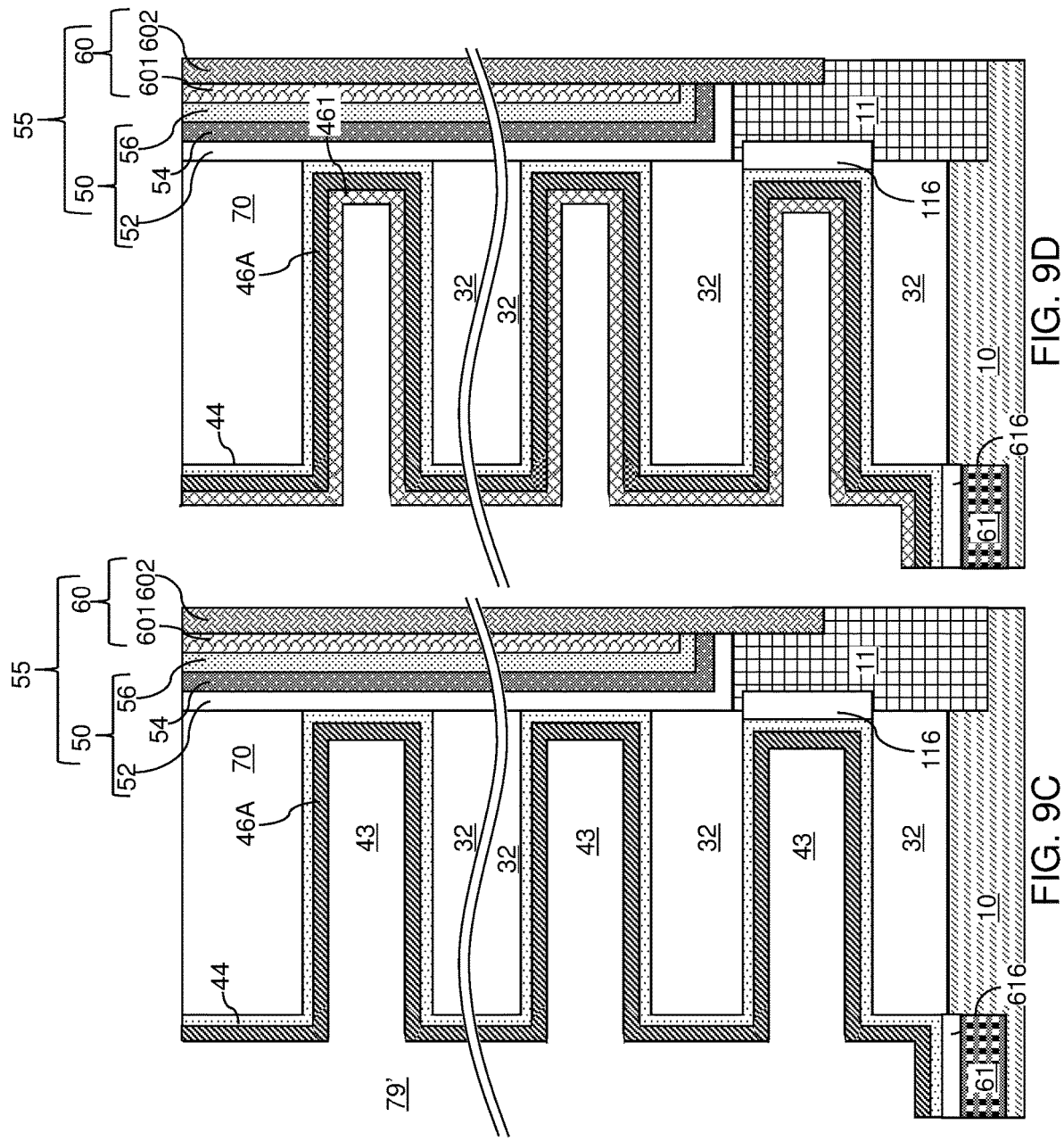

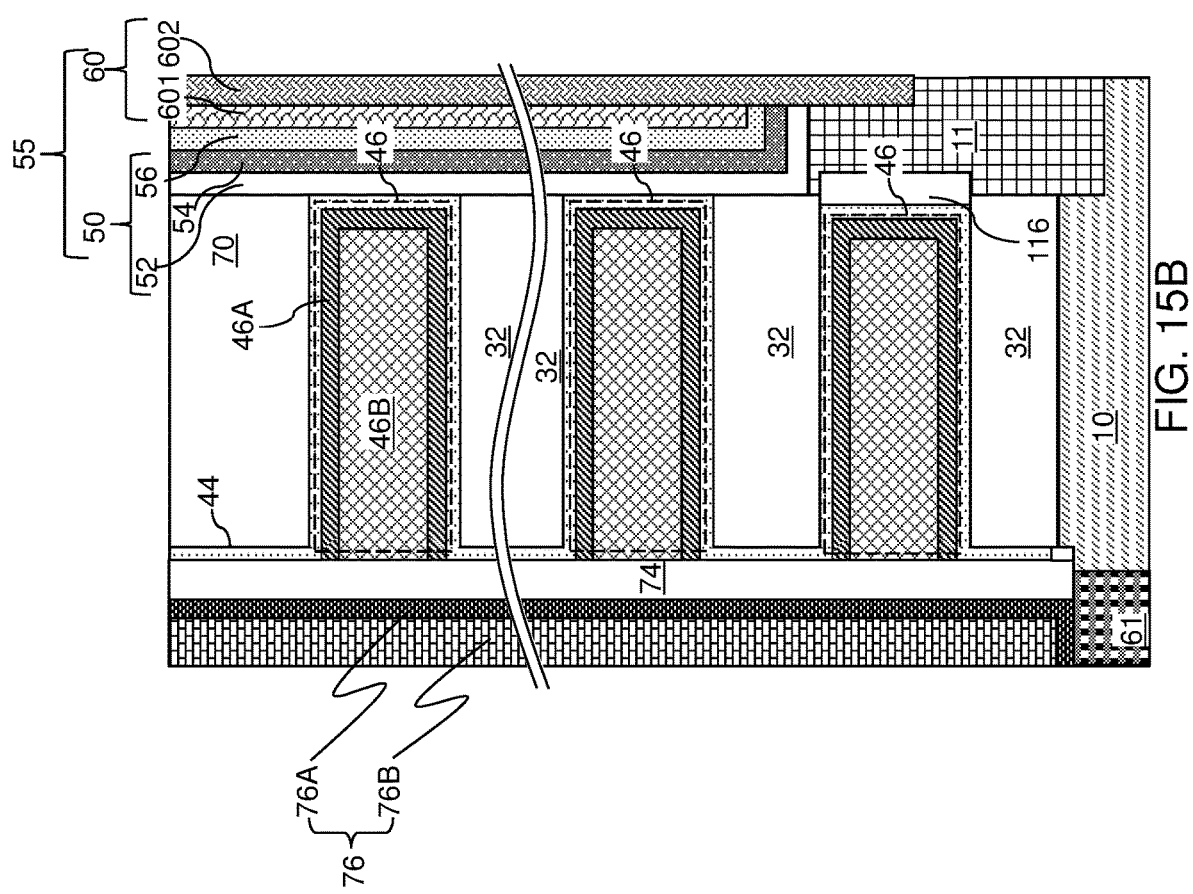

FLUORINE-FREE TUNGSTEN DEPOSITION PROCESS EMPLOYING IN-SITU OXIDATION AND APPARATUSES FOR EFFECTING THE SAME

FIELD

The present disclosure relates generally to the field of semiconductor manufacturing, and particularly to a fluorine-free tungsten deposition process employing fluorine removal through an in-situ oxidation process and apparatuses for effecting the same.

BACKGROUND

Tungsten can be efficiently deposited employing a fluorine-containing precursor gas such as tungsten hexafluoride in a chemical vapor deposition process. Unfortunately, residual fluorine atoms that remain in the deposited tungsten material can cause adverse effects on surrounding material portions. For example, a three-dimensional memory device including a vertically alternating stack of insulating layers and electrically conductive layers can be formed employing an in-process vertically alternating stack of the insulating layers and sacrificial material layers, forming laterally-extending cavities by removing the sacrificial material layers, and by depositing tungsten in the laterally-extending cavities in a chemical vapor deposition process that employs tungsten hexafluoride as a precursor gas. Residual fluorine atoms that remain in the tungsten-containing electrically conductive layers can react with dielectric material layers such as silicon oxide layers. In this case, the fluorine atoms etch the silicon oxide material and cause physical voids, which can be paths for electrical shorts upon migration of conductive materials thereinto. Thus, an efficient method is desired for removing residual fluorine atoms during a chemical vapor deposition process employing a fluorine-containing tungsten precursor gas.

SUMMARY

According to an aspect of the present disclosure, a method of depositing tungsten over a substrate includes disposing the substrate into a vacuum enclosure of a tungsten deposition apparatus, performing a first tungsten deposition process that deposits a first tungsten layer over a physically exposed surface of the substrate by flowing a fluorine-containing tungsten precursor gas into the vacuum enclosure, performing an in-situ oxidation process by exposing the first tungsten layer to an oxidation agent gas while the substrate remains within the vacuum enclosure without breaking vacuum and forming a tungsten oxyfluoride gas which is pumped out of the vacuum enclosure, and performing a second tungsten deposition process that deposits a second tungsten layer on the first tungsten layer by flowing the fluorine-containing tungsten precursor gas into the vacuum enclosure in a second tungsten deposition process after the in-situ oxidation process.

According to another aspect of the present disclosure, a tungsten deposition apparatus is provided, which comprises: a process chamber comprising a vacuum enclosure and configured to hold at least one substrate therein; a gas distribution manifold configured to flow a fluorine-containing tungsten precursor gas into the vacuum enclosure; a process controller comprising a processor in communication with a memory and configured to execute an automated program that sequentially perform a set of processing steps that comprise: a first tungsten deposition process that deposits a first tungsten layer on a physically exposed surface of each of the at least one substrate by flowing the fluorine-containing tungsten precursor gas into the vacuum enclosure in a first tungsten deposition process; an in-situ oxidation process that exposes the first tungsten layer to an oxidation agent gas while the at least one substrate remains within the vacuum enclosure without breaking vacuum and forms a tungsten oxyfluoride gas which is pumped out of the vacuum enclosure; and a second tungsten deposition process that deposits a second tungsten layer on each first tungsten layer by flowing the fluorine-containing tungsten precursor gas into the vacuum enclosure in a second tungsten deposition process after the in-situ oxidation process.

BRIEF DESCRIPTION OF THE DRAWINGS

FIG. 4B is a top-down view of the exemplary semiconductor structure of FIG. 4A. The vertical plane A-A' is the plane of the cross-section for FIG. 4A.

FIGS. 5A-5H are sequential schematic vertical cross-sectional views of a memory opening within the exemplary semiconductor structure during formation of a memory stack structure, an optional dielectric core, and a drain region therein according to an embodiment of the present disclosure.

FIGS. 9A-9G are sequential vertical cross-sectional views of a region of the exemplary semiconductor structure during formation of electrically conductive layers according to an embodiment of the present disclosure.

FIG. 15B is a magnified view of a region of the exemplary semiconductor structure of FIG. 15A.

DETAILED DESCRIPTION

Figure 1:
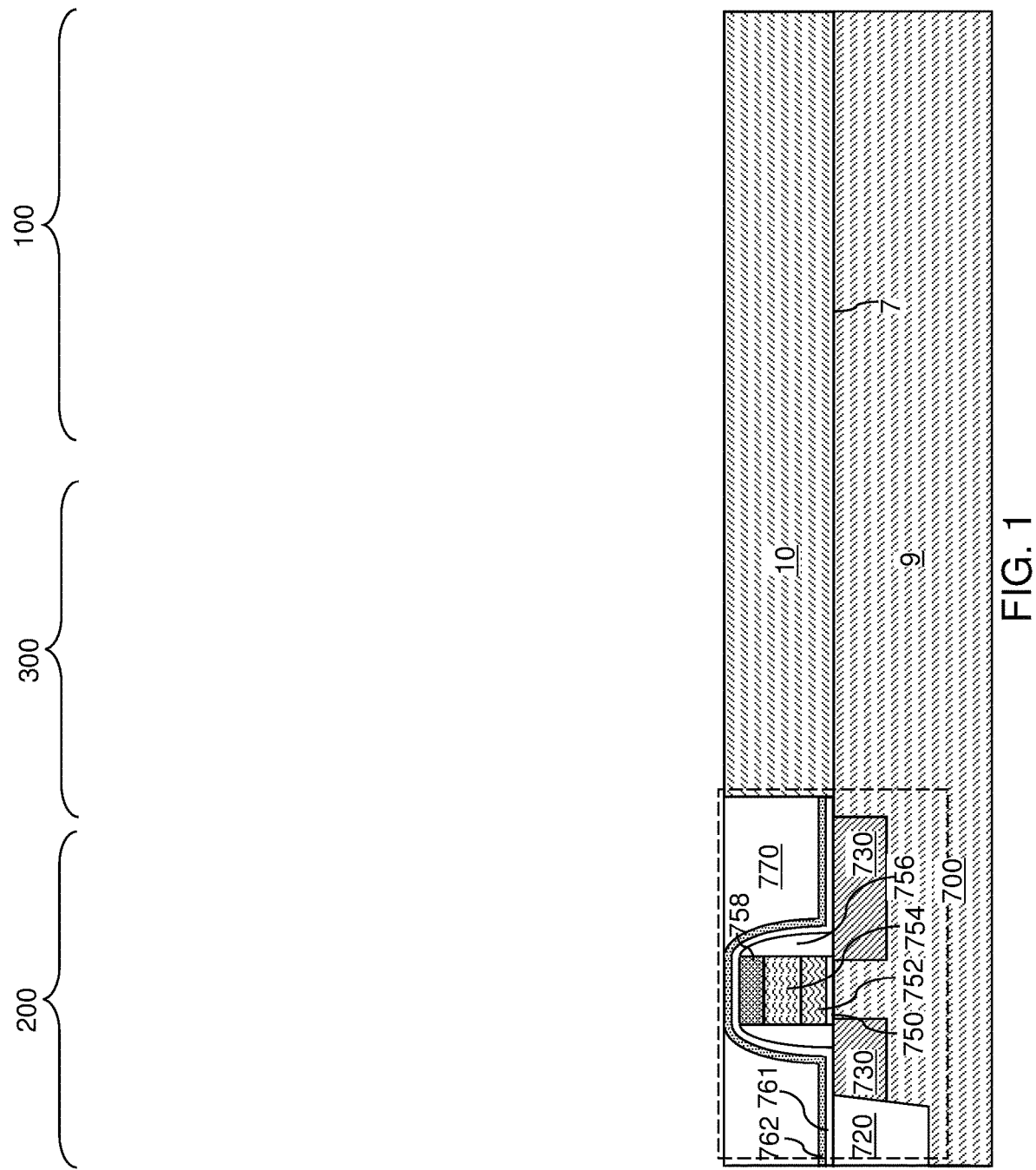
FIG. 1 is a schematic vertical cross-sectional view of an exemplary semiconductor structure after formation of at least one peripheral device, a semiconductor material layer, and a gate dielectric layer according to an embodiment of the present disclosure.

As discussed above, the present disclosure is directed to a fluorine-free tungsten deposition process employing fluorine removal through an in-situ oxidation process and apparatuses for effecting the same, the various aspects of which are described below. The method of forming a fluorine-free tungsten film is described employing an exemplary semiconductor structure for forming a three-dimensional array of memory elements. However, the methods of the present disclosure can be applied for forming any type of tungsten film that requires low fluorine content.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

Referring to FIG. 1, an exemplary semiconductor structure according to an embodiment of the present disclosure is illustrated, which can be employed, for example, to fabricate a device structure containing vertical NAND memory devices. The exemplary semiconductor structure includes a substrate (9, 10), which can be a semiconductor substrate. The substrate can include a substrate semiconductor layer 9 (e.g., silicon wafer) and an optional semiconductor material layer 10 (e.g., a doped well in the silicon wafer or an epitaxial silicon layer on a silicon wafer). The substrate can have a major surface 7, which can be, for example, a topmost surface of the substrate semiconductor layer 9. At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. Portions of the deposited semiconductor material located above the top surface of the planarization dielectric layer 170 can be removed, for example, by chemical mechanical planarization (CMP). The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. In one alternative embodiment, the peripheral device region 200 containing the at least one semiconductor device 700 for a peripheral circuitry may be located under the memory array region 100 in a CMOS under array configuration. In another alternative embodiment, the peripheral device region 200 may be located on a separate substrate which is subsequently bonded to the memory array region 100.

Figure 2:
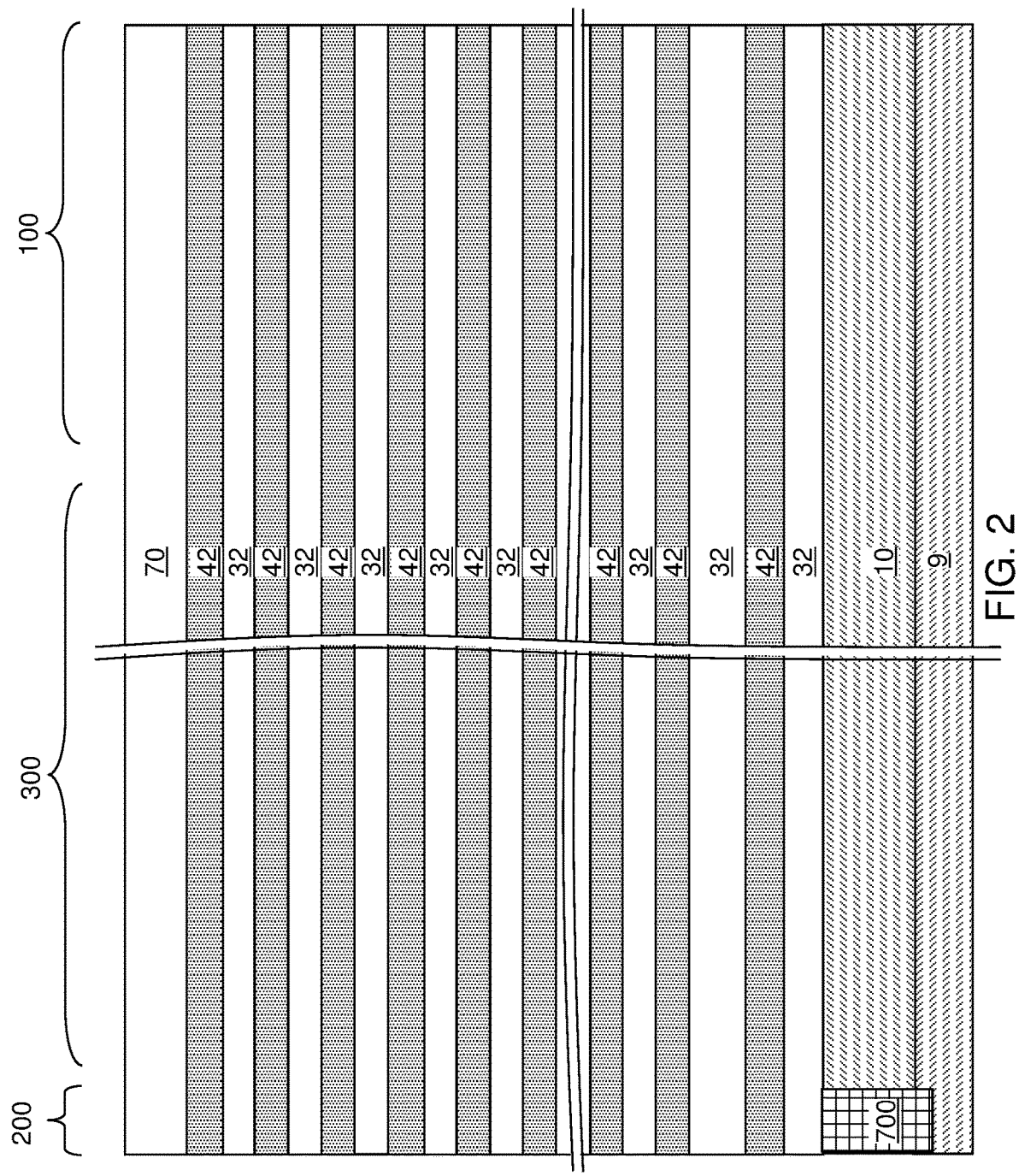
FIG. 2 is a schematic vertical cross-sectional view of the exemplary semiconductor structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). The stack of the alternating plurality is herein referred to as an alternating stack (32, 42). In one embodiment, the alternating stack (32, 42) can include insulating layers 32 composed of a first material, and sacrificial material layers 42 composed of a second material different from the first material. The first material of the insulating layers 32 can be at least one insulating material. As such, each insulating layer 32 can be an insulating material layer. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material. The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the insulating layers 32 can include silicon oxide, and sacrificial material layers can include silicon nitride sacrificial material layers.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. Optionally, an insulating cap layer 70 can be formed over the alternating stack (32, 42). In one embodiment, the insulating cap layer 70 can include a dielectric material that can be employed for the insulating layers 32 as described above.

Figure 3:
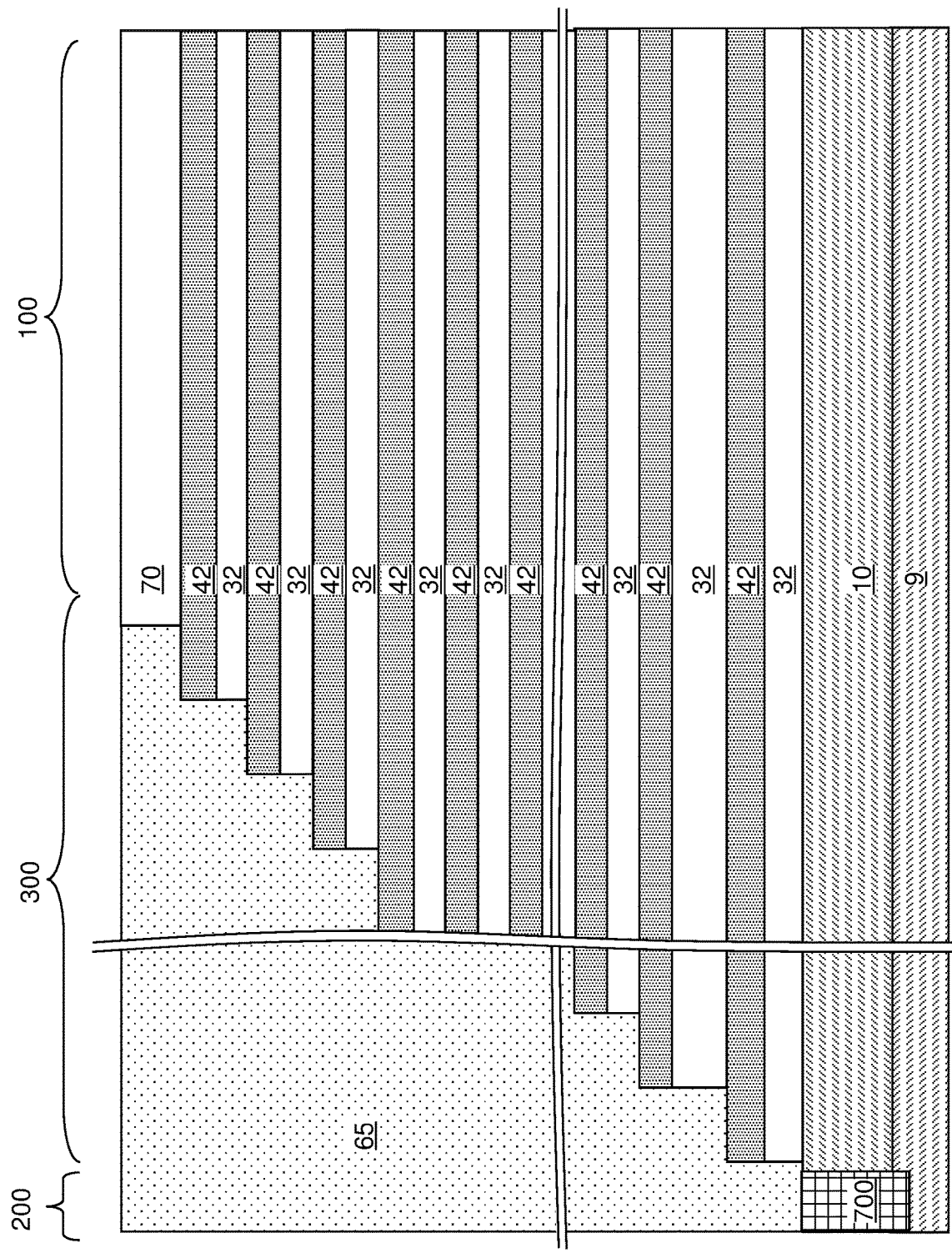
FIG. 3 is a schematic vertical cross-sectional view of the exemplary semiconductor structure after formation of stepped terraces and a retro-stepped dielectric material portion according to an embodiment of the present disclosure.

Referring to FIG. 3, stepped surfaces are formed at a peripheral region of the alternating stack (32, 42), which is herein referred to as a terrace region. The terrace region is formed in the contact region 300, which is located between the memory array region 100 and the peripheral device region 200 containing the at least one semiconductor device for the peripheral circuitry. Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). Optionally, drain select level isolation structures 72 can be formed through the insulating cap layer 70 and a subset of the sacrificial material layers 42 located at drain select levels.

Figure 4A:
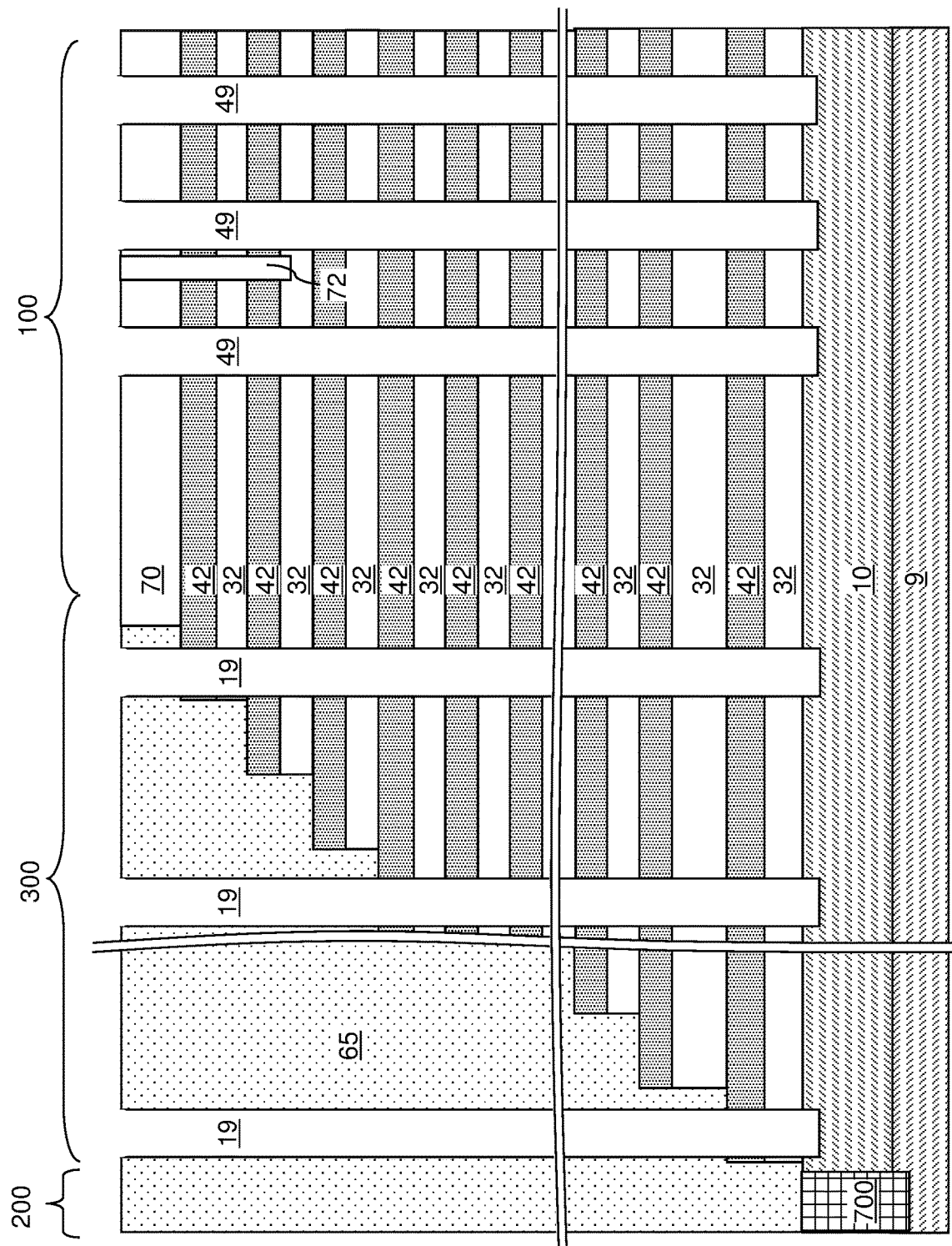
FIG. 4A is a schematic vertical cross-sectional view of the exemplary semiconductor structure after formation of memory openings and support openings according to an embodiment of the present disclosure.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19.

The memory openings 49 and the support openings 19 can extend from the top surface of the alternating stack (32, 42) to at least the horizontal plane including the topmost surface of the semiconductor material layer 10. Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300.

FIGS. 5A-5H illustrate structural changes in a memory opening 49, which is one of the memory openings 49 in the exemplary semiconductor structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10.

Referring to FIG. 5B, an optional pedestal channel portion (e.g., an epitaxial pedestal) 11 can be formed at the bottom portion of each memory opening 49 and each support openings 19, for example, by selective epitaxy. The pedestal channel portion 11 may comprise a single crystalline silicon pedestal.

Figure 5C:
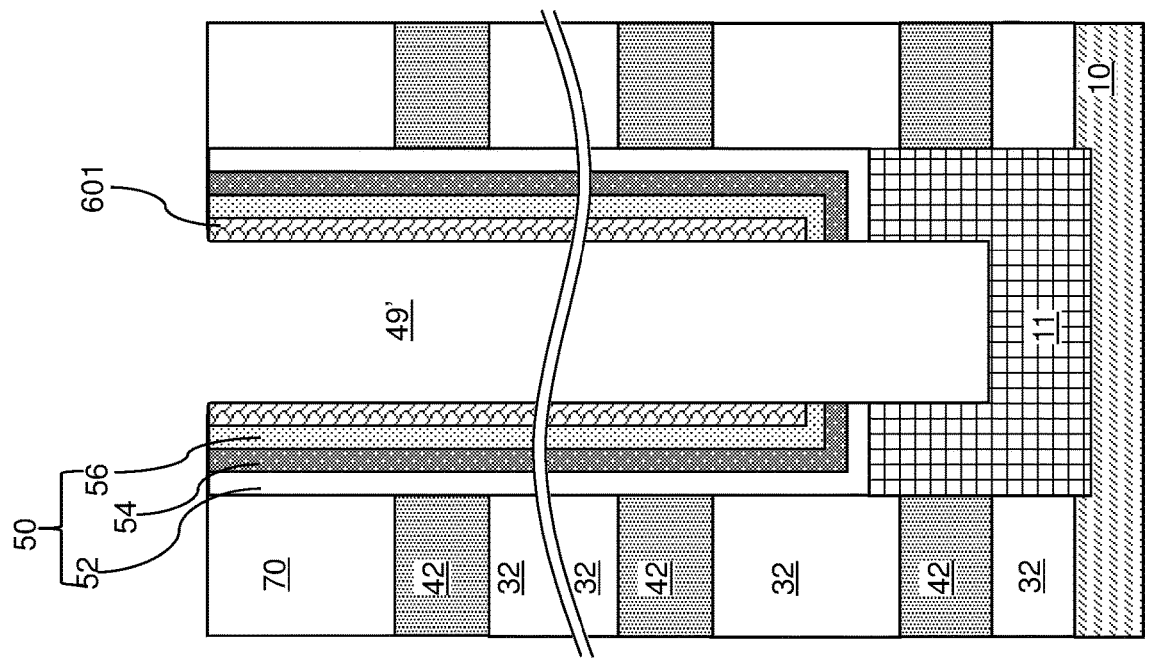

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49. The blocking dielectric layer 52 may comprise silicon oxide, the charge storage layer 54 may comprise silicon nitride, and the tunneling dielectric layer 56 may comprise silicon oxide or a stack of silicon oxide/nitride/oxide ("ONO") layers.

Figure 5D:
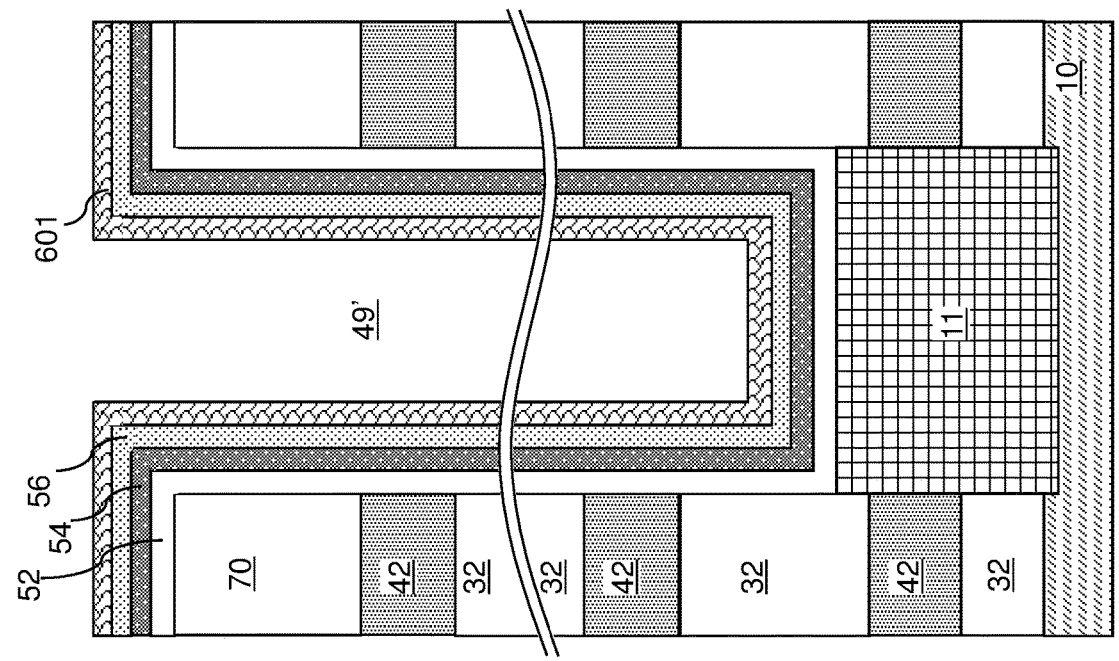

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region. A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The materials of the first semiconductor channel layer 601 and the second semiconductor channel layer 602 are collectively referred to as a semiconductor channel material. The semiconductor channel material may comprise polysilicon or amorphous silicon which is subsequently crystallized into polysilicon.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening.

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process. Each remaining portion of the second semiconductor channel layer 602 can be located entirety within a memory opening 49 or entirely within a support opening 19. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. Each adjoining set of a blocking dielectric layer 52, a charge storage layer 54, and a tunneling dielectric layer 56 collectively constitute a memory film 50, which can store electrical charges with a macroscopic retention time.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62.

Each combination of a memory film 50 and a vertical semiconductor channel 60 within a memory opening 49 constitutes a memory stack structure 55. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
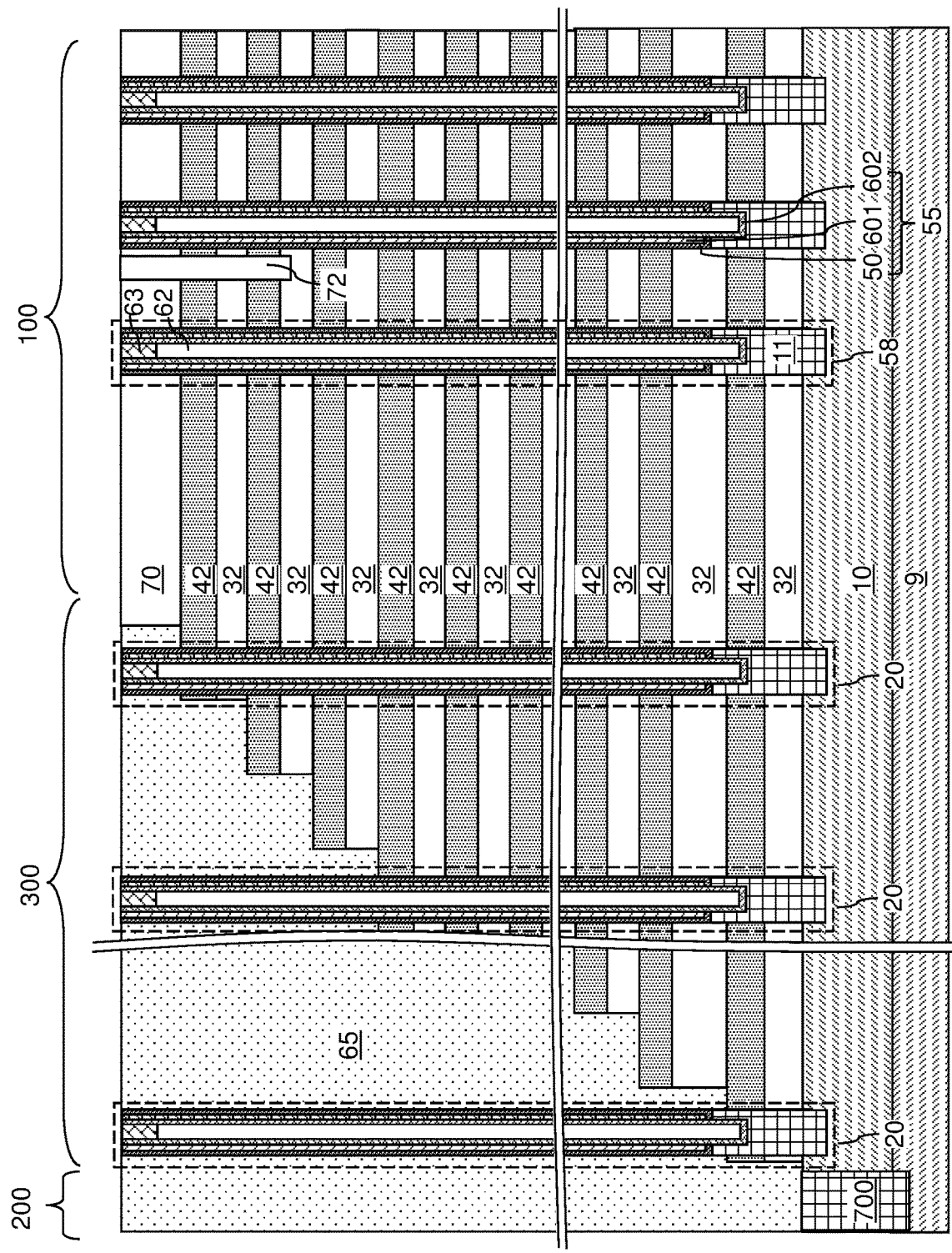
FIG. 6 is a schematic vertical cross-sectional view of the exemplary semiconductor structure after formation of memory stack structures and support pillar structures according to an embodiment of the present disclosure.

Referring to FIG. 6, the exemplary semiconductor structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Figure 7A:
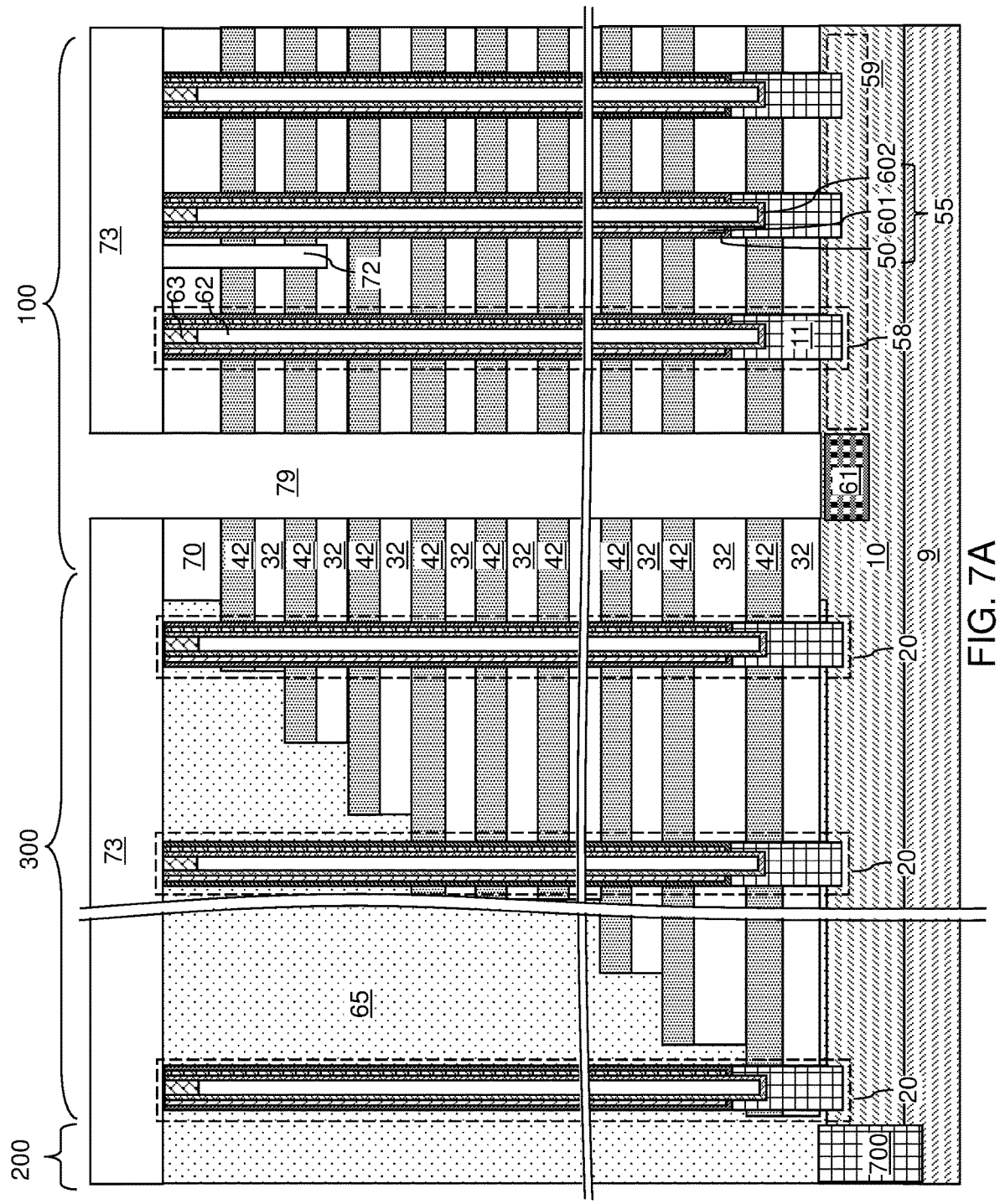
FIG. 7A is a schematic vertical cross-sectional view of the exemplary semiconductor structure after formation of backside trenches according to an embodiment of the present disclosure.
Figure 7B:
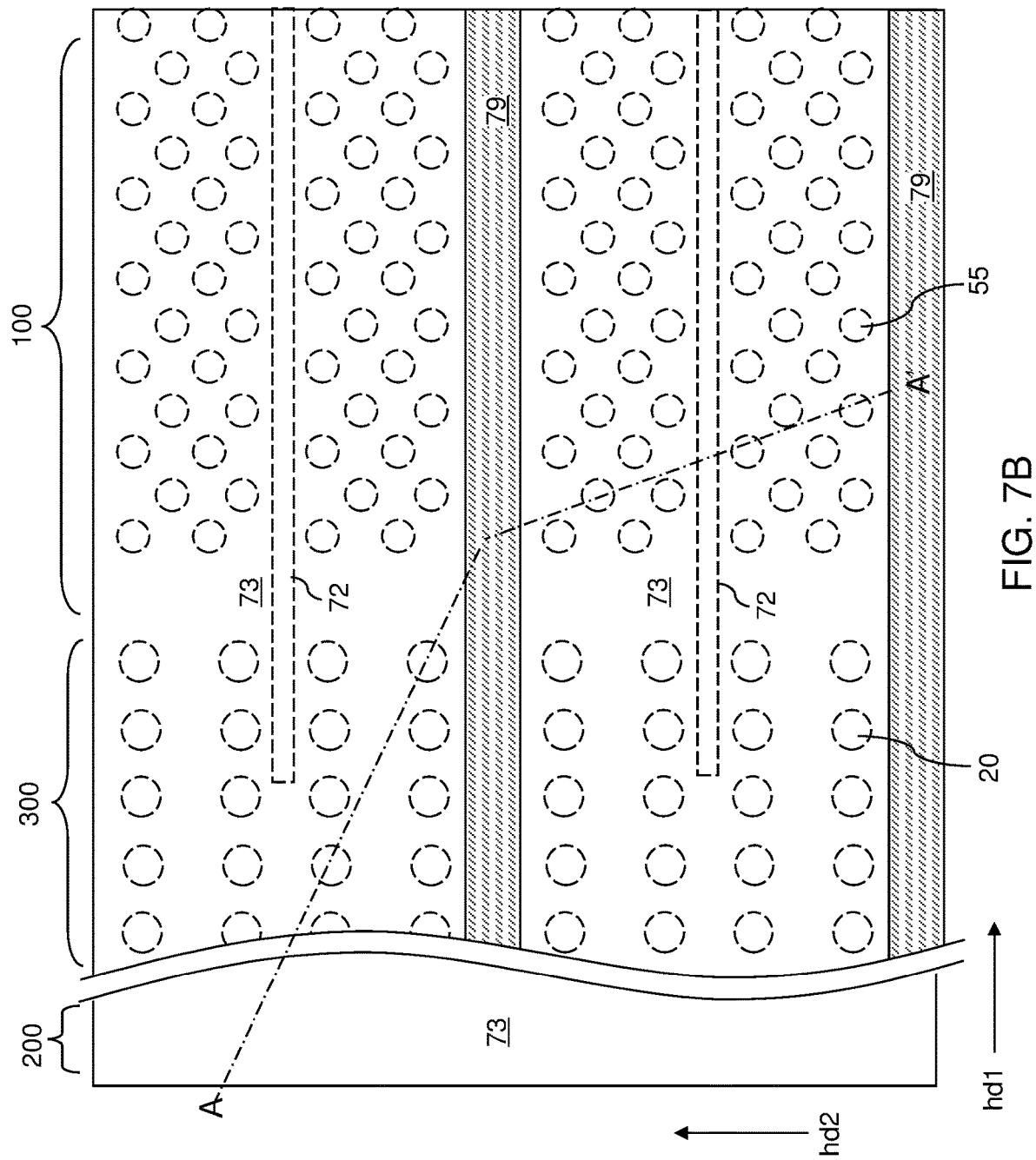
FIG. 7B is a partial see-through top-down view of the exemplary semiconductor structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300.

In one embodiment, the backside trenches 79 can laterally extend along a first horizontal direction (e.g., word line direction) hd1 and can be laterally spaced apart from each other along a second horizontal direction (e.g., bit line direction) hd2 that is perpendicular to the first horizontal direction hd1. Multiple rows of memory opening fill structures 58 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
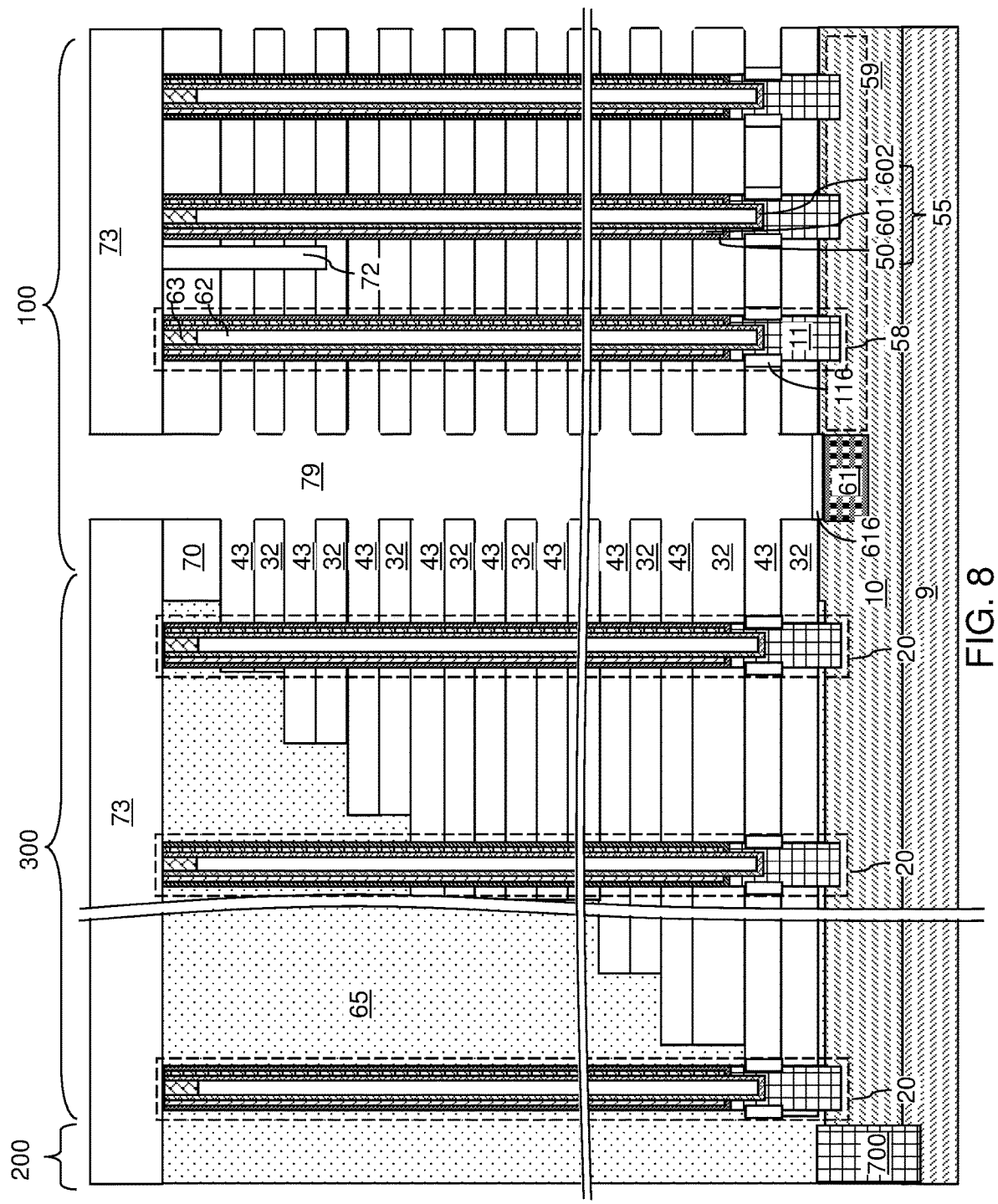
FIG. 8 is a schematic vertical cross-sectional view of the exemplary semiconductor structure after formation of laterally-extending cavities according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary semiconductor structure of FIG. 8. Laterally-extending cavities 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary semiconductor structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the laterally-extending cavities 43 are present within volumes previously occupied by the sacrificial material layers 42.

Each laterally-extending cavity 43 may have a lateral dimension that is greater than the vertical extent of the cavity. In other words, the lateral dimension of each laterally-extending cavity 43 can be greater than the height of the laterally-extending cavity 43. A plurality of laterally-extending cavities 43 can be formed in the volumes from which the second material of the sacrificial material layers 42 is removed. The memory openings in which the memory stack structures 55 are formed are herein referred to as front side openings or front side cavities in contrast with the laterally-extending cavities 43. In one embodiment, the memory array region 100 comprises an array of monolithic three-dimensional NAND strings having a plurality of device levels disposed above the substrate (9, 10). In this case, each laterally-extending cavity 43 can define a space for receiving a respective word line of the array of monolithic three-dimensional NAND strings.

Each of the plurality of laterally-extending cavities 43 can extend substantially parallel to the top surface of the substrate (9, 10). A laterally-extending cavity 43 can be vertically bounded by a top surface of an underlying insulating layer 32 and a bottom surface of an overlying insulating layer 32. In one embodiment, each laterally-extending cavity 43 can have a uniform height throughout. The insulating layers 32 can be supported by vertically-extending structures (58, 20) that extend through each of the insulating layers 32 within the vertically alternating stack of the insulating layers 32 and the laterally-extending cavities 43. The vertically-extending structures (58, 20) can include memory opening fill structures 58 and the support pillar structures 20.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the laterally-extending cavities 43. In case the blocking dielectric layer 52 is present within each memory opening, the backside blocking dielectric layer 44 is optional. In case the blocking dielectric layer 52 is omitted, the backside blocking dielectric layer 44 is present. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the laterally-extending cavities 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the laterally-extending cavities 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Referring to FIG. 9D, a first tungsten deposition process can be performed to deposit a first tungsten layer 461 on physically exposed surfaces of the metallic barrier layer 46A. The first tungsten deposition process can be performed by placing the exemplary semiconductor structure in a vacuum enclosure of a process chamber in a tungsten deposition apparatus, and by flowing a fluorine-containing tungsten precursor gas into a vacuum enclosure. Exemplary tungsten DVD or ALD apparatuses that can be employed to perform the first tungsten deposition process are described in detail in a subsequent section below.

The fluorine-containing tungsten precursor gas can include, for example, tungsten hexafluoride ($WF_6$), although derivatives of tungsten hexafluoride (such as $WF_5$) may also be employed. In some embodiments, at least one nucleation agent gas such as silane, diborane, and/or dichlorosilane may be flowed into the process chamber at a nucleation phase of the first tungsten deposition process concurrently with, or alternately with, flow of the fluorine-containing tungsten precursor gas to facilitate nucleation of tungsten on the physically exposed surfaces of the metallic barrier layer 46A. In this case, interfacial portions of the first tungsten layer 461 that are proximal to the metallic barrier layer 46A may include silicon and/or boron.

The first tungsten deposition process can be a CVD or ALD process performed in a vacuum chamber of a CVD or ALD apparatus. In this case, the processing temperature may be in a range from 380 degrees Celsius to 480 degrees Celsius, such as 430 degrees Celsius to 450 degrees Celsius, although lower and higher temperatures can also be employed. The partial pressure of the fluorine-containing tungsten precursor gas may be in a range from 1 mTorr to 100 mTorr, although lesser and greater partial pressures may also be employed. The first tungsten layer 461 can be conformally deposited on all physically exposed surfaces of the metallic barrier layer 46A. The thickness of the first tungsten layer 461 can be selected to be in a range from 10% to 40% of the height of a laterally-extending cavity 43 that is vertically bounded by two horizontal surfaces of the metallic barrier layer 46A. For example, if the height of each laterally-extending cavity 43 after formation of the metallic barrier layer 46A is in a range from 10 nm to 40 nm, then the thickness of the first tungsten layer 461 can be in a range from 1 nm to 16 nm, such as from 2 nm to 8 nm, although lesser and greater thicknesses can also be employed.

A first in-situ oxidation process can be subsequently performed either in the process chamber that performs the first tungsten deposition process or in an oxidation chamber that is connected to the process chamber directly or through a vacuum environment (such as a transfer chamber under vacuum). Generally, the first in-situ oxidation process is performed within a tungsten deposition apparatus without breaking vacuum and without transferring the exemplary structure outside the tungsten deposition apparatus, therefore being an "in-situ" process. The first oxidation process is performed before the first tungsten layer pinches off (i.e., encloses) the volume of the laterally-extending cavities 43. Residual fluorine atoms in the first tungsten layer 461 and/or in the laterally-extending cavities 43 can be incorporated into a tungsten oxyfluoride layer (e.g., $WO_2F_2$) by exposing the first tungsten layer 461 to an oxidation agent gas while the exemplary structure remains within the vacuum enclosure of the tungsten deposition apparatus. The first in-situ oxidation process can be performed by flowing an oxidation agent gas into the process chamber or into the oxidation chamber. The oxidation agent gas includes oxygen gas ($O_2$), ozone, water vapor, or nitrous oxide at a concentration in a range from 1% to 100%, the balance (if any) being an inert gas such as nitrogen, argon, and/or helium. In one embodiment, the water vapor may be generated by an in-situ steam generation (ISSG) process using low pressure hydrogen and oxygen source gases. The partial pressure of the oxygen gas ($O_2$), ozone, water vapor, or nitrous oxide during the oxidation process may be in a range from 0.01 mTorr to 1 Torr, although lower and higher pressures may also be employed. The duration of the oxidation process may be in a range from 5 seconds to 600 seconds, such as from 30 seconds to 120 seconds, although shorter and longer durations may also be employed.

During the oxidation process, oxygen atoms diffuse into the first tungsten layer 461 and combine with residual fluorine atoms in the first tungsten layer 461. The combination efficiency of the oxidation agent gas with the residual fluorine atoms in the first tungsten layer 461 decreases with the thickness of the first tungsten layer 461. Thus, the thinner the first tungsten layer 461, the more efficient the oxidation agent gas is in combining with the residual fluorine atoms in the first tungsten layer 461. In case a $WF_6$ molecule is trapped within the first tungsten layer 461, the following set of reactions can occur to remove the fluorine atoms from the $WF_6$ molecule:

$$WF_6 + H_2O \rightarrow WOF_4 + 2HF; \text{ and}$$

$$WOF_4 + H_2O \rightarrow WO_2F_2 + 2HF.$$

In this case, both $WOF_4$ and $WO_2F_2$ tungsten oxyfluoride layers have high vapor pressure, and sublimation of $WOF_4$ and $WO_2F_2$ occurs around 110 degrees Celsius. If the oxidation temperature is below 110 degrees Celsius such that a solid $WOF_4$ and/or $WO_2F_2$ tungsten oxyfluoride layers are formed, then structure containing the tungsten oxyfluoride layer is preheated to at least 110 degrees Celsius to sublimate the tungsten oxyfluoride layer. HF molecules evaporate easily and are pumped out of the system with the sublimated tungsten oxyfluoride gas.

Figure 9F:
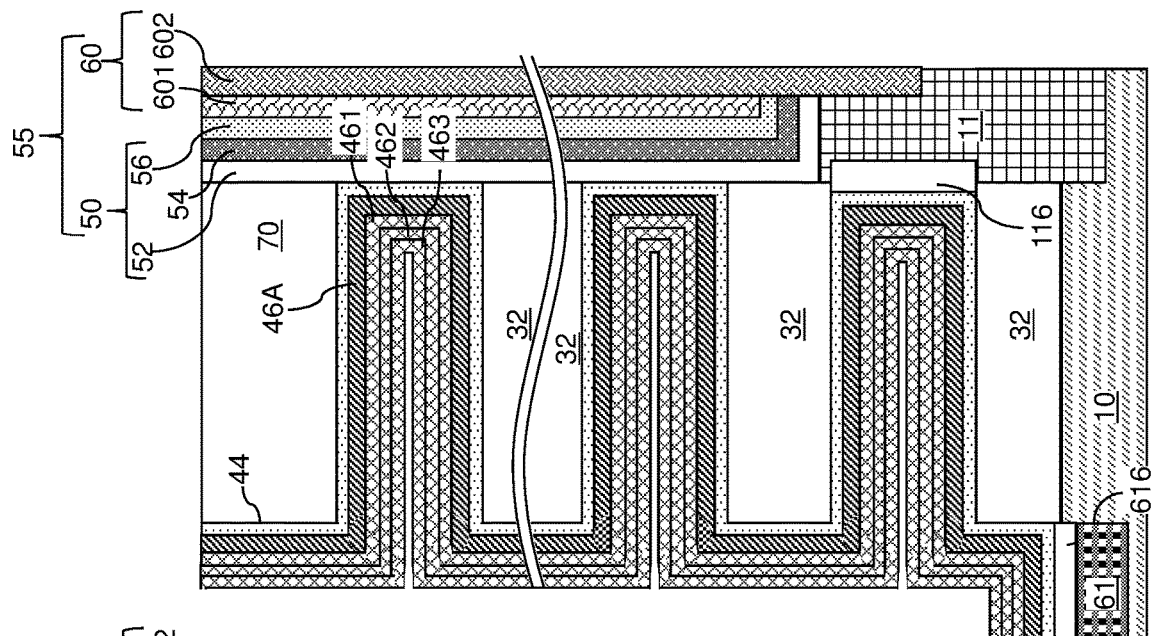
Figure 9E:
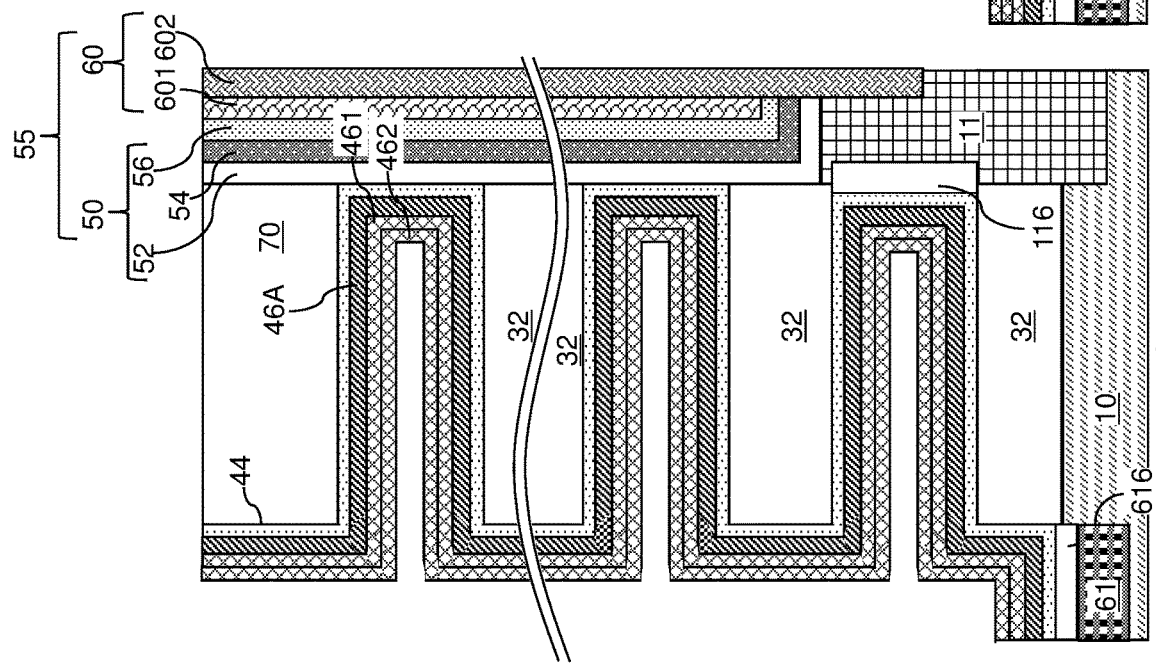

Referring to FIG. 9E, a second tungsten deposition process can be performed to deposit a second tungsten layer 462 on physically exposed surfaces of the metallic barrier layer 46A. The exemplary semiconductor structure may remain in the vacuum enclosure of the process chamber that performs the first tungsten deposition process, or may be transferred back from the oxidation chamber into the vacuum enclosure of the process chamber that performs the first tungsten deposition process. A fluorine-containing tungsten precursor gas is flowed into the vacuum enclosure during the second tungsten deposition process. The fluorine-containing tungsten precursor gas can include tungsten hexafluoride. Generally, use of a nucleation agent gas is not necessary during the second tungsten deposition process because tungsten can grow from pre-existing tungsten surfaces.

The second tungsten deposition process can be a CVD or ALD process performed in a vacuum chamber. In this case, the processing temperature may be in a range from 380 degrees Celsius to 480 degrees Celsius, although lower and higher temperatures can also be employed. The partial pressure of the fluorine-containing tungsten precursor gas may be in a range from 1 mTorr to 100 mTorr, although lesser and greater partial pressures may also be employed. The second tungsten layer 462 can be conformally deposited on all physically exposed surfaces of the first tungsten layer 461. The thickness of the second tungsten layer 462 can be selected to be in a range from 50% to 200% of the thickness of the first tungsten layer 461, although lesser and greater thicknesses can also be employed. For example, the thickness of the second tungsten layer 462 can be in a range from 1 nm to 16 nm, such as from 2 nm to 8 nm, although lesser and greater thicknesses can also be employed.

A second in-situ oxidation process can be subsequently performed either in the process chamber or in the oxidation chamber. Generally, the second in-situ oxidation process is performed within the tungsten deposition apparatus without breaking vacuum and without transferring the exemplary structure outside the tungsten deposition apparatus. Residual fluorine atoms in the second tungsten layer 462 can be removed by exposing the second tungsten layer 462 to an oxidation agent gas while the exemplary structure remains within the tungsten deposition apparatus. The process parameters of the second in-situ oxidation process may be the same as the process parameters of the first in-situ oxidation process.

Referring to FIG. 9F, a third tungsten deposition process and a third in-situ oxidation process can be performed in the same manner as the second tungsten deposition process and the second in-situ oxidation process. The processing parameters of the third tungsten deposition process can be the same as the processing parameters of the second tungsten deposition process, and the processing parameters of the third in-situ oxidation process can be the same as the processing parameters of the second in-situ oxidation process. A third tungsten layer 463 that is essentially free of fluorine can be formed.

Figure 9G:
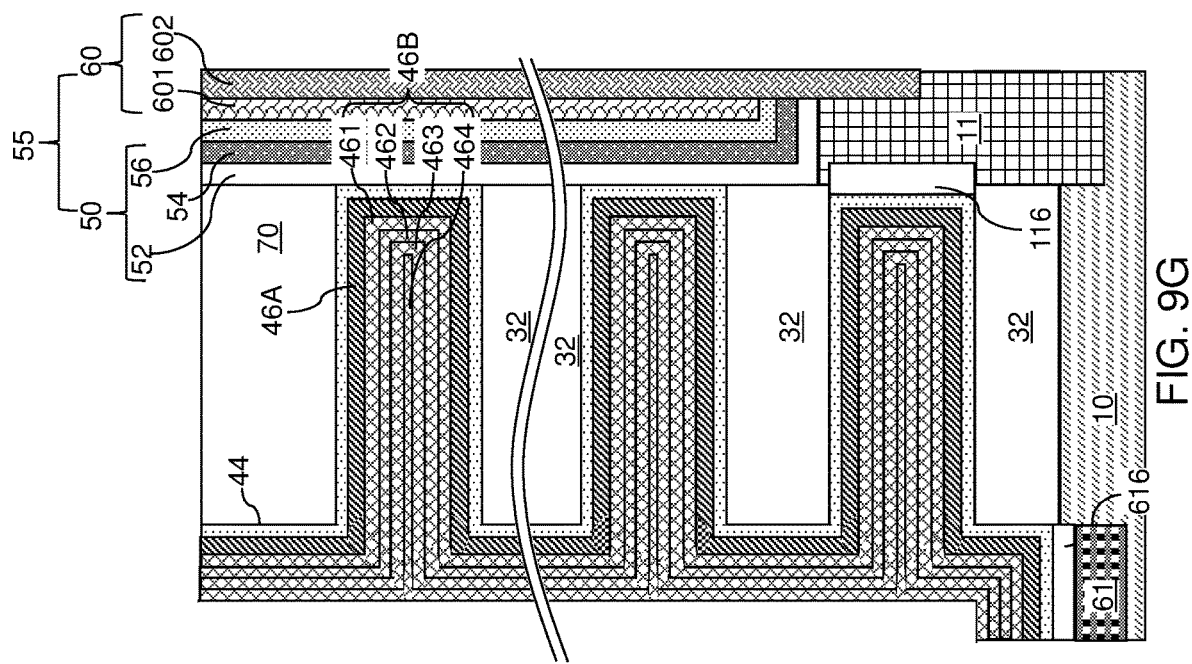

Referring to FIG. 9G, optional additional tungsten deposition processes and additional in-situ oxidation processes can be alternately performed to optionally form at least one additional tungsten layer 464 until the entire volume of the laterally-extending cavities 43 is filled with tungsten layers (461, 462, 463, 464). While the present disclosure is described employing an embodiment in which four tungsten layers (461, 462, 463, 464) are employed to fill the laterally-extending cavities 43, embodiments are expressly contemplated herein in which two, three, five or more tungsten layers are employed to fill the laterally-extending cavities 43. Further, embodiments are expressly contemplated herein in which a tungsten film is deposited on planar structures or on structures having a low aspect ratio. In such embodiments, a single tungsten layer (such as the first tungsten layer 461) may be employed to deposit a fluorine-free tungsten film.

According to an aspect of the present disclosure, tungsten deposition apparatuses specifically configured to sequentially perform the processing steps of FIGS. 9D-9G are provided, which are illustrated in FIGS. 10-13.

Figure 10:
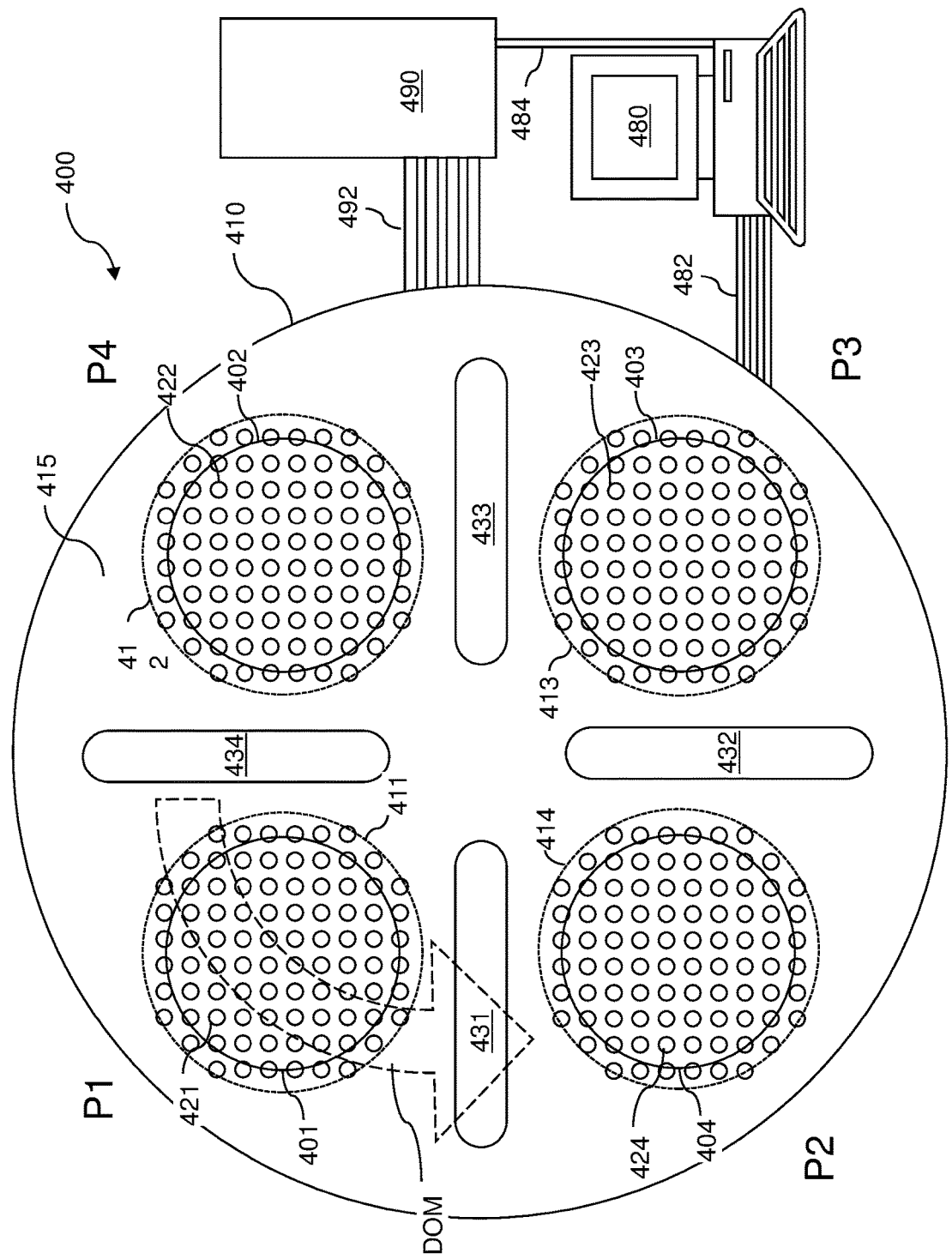
FIG. 10 is a schematic view of a first tungsten deposition apparatus according to a first embodiment of the present disclosure.

Referring to FIG. 10, a first tungsten deposition apparatus 400 according to a first embodiment of the present disclosure is illustrated. The first exemplary tungsten deposition apparatus 400 is a CVD or ALD apparatus which includes a process chamber comprising a vacuum enclosure 410 and configured to hold at least one substrate (401, 402, 403 and/or 404) therein. The substrate may comprise a silicon wafer 9 with the structure shown in FIG. 9B located thereon. In one embodiment, the process chamber can be configured to hold a plurality of substrates (401, 402, 403, 404) simultaneously, and to perform the multiple tungsten deposition steps and/or multiple oxidation steps simultaneously and/or sequentially. In one embodiment, the process chamber can include a plurality of deposition stations having a shape of substrate pockets (411, 412, 413, 414) containing respective support pedestals configured to hold the plurality of substrates (401, 402, 403, 404). In one embodiment, the plurality of substrate pockets (411, 412, 413, 414) can include a plurality of recesses from a planar top surface of a circular platen 415 that is configured to rotate around a vertical axis passing through the geometrical center of the entire volume of the vacuum enclosure using an indexer. In one embodiment, the vacuum enclosure 410 may have a circular cylindrical shape in which the diameter of the bottom circular surface is selected to accommodate a plurality of substrate pockets (411, 412, 413, 414) within the bottom surface of the vacuum enclosure 410. In one embodiment, the platen 415 including the plurality of substrate pockets (411, 412, 413, 414) can be mounted on the bottom surface of the vacuum enclosure 410, and may be configured to rotate around the vertical axis passing through the geometrical center of the vacuum enclosure 410. A rotation actuation mechanism (such as an indexer containing a combination of a motor and a gear assembly) may be mounted on the bottom surface of the vacuum enclosure 410 to enable rotation of the platen 415. An exemplary direction of the rotational movement DOM of the platen 415 is illustrated with an arrow in FIG. 10. Alternatively, the indexer may include an arm which moves the substrates between the substrate pockets (411, 412, 413, 414) in a stationary platen 415.

The first tungsten deposition apparatus 400 can include a gas distribution manifold 490 configured to flow process gases into the vacuum enclosure through gas lines 492, and a vacuum control system that includes vacuum pumps (not illustrated) connected to pumping ports (431, 432, 433, 434) that are adjoined to the vacuum enclosure. In one embodiment, the pumping ports (431, 432, 433, 434) and the plurality of substrate pockets (411, 412, 413, 414) can alternate along an azimuthal direction around the vertical axis passing through the geometrical center of the vacuum enclosure 410. The gas distribution manifold 490 is configured to provide a controlled flow of a fluorine-containing tungsten precursor gas into the vacuum enclosure 410. In case the in-situ oxidation process is to be performed in the vacuum enclosure 410, the gas distribution manifold 490 is also configured to provide a controlled flow of oxidation agent gas into the vacuum enclosure 410. A temperature control mechanism (not shown) such as a heater, a cooler, and peripheral devices supporting operation of the heater and the cooler may be provided.

A process controller 480 can control movement of the indexer, such as the platen 415 including the plurality of substrate pockets (411, 412, 413, 414), temperature control of the plurality of substrate pockets (or any mechanism for controlling temperature of the substrates (401, 402, 403, 404)), and control of the flow of the fluorine-containing tungsten precursor gas, the oxidation agent gas, a purge gas, a backfill gas, and any other process gas that may be needed for operation of the process chamber. Generally, the process controller 480 comprises a processor in communication with a memory (e.g., a special or general purpose computer) and configured to execute an automated program that sequentially perform a set of processing steps. Control signals and feedback data signal can be communicated between the process controller 480 and various components of the process chamber via signal cables 482 and/or via wireless communication.

The automated program includes various steps for sequentially performing the processing steps of FIGS. 9D-9G or variants thereof that includes a different total number of tungsten deposition steps and/or oxidation steps on each of the (401, 402, 403, 404). In one embodiment, the substrates (401, 402, 403, 404) can be loaded into the process chamber 410 one at a time, and can move around the various positions within the process chamber in a respective substrate pocket (411, 412, 413, 414) as the platen rotates, and may complete all of the processing steps of FIGS. 9D-9G or variants thereof during a single rotation of the platen by 360 degrees around the vertical axis that passes through the geometrical center of the vacuum enclosure 410.

In an illustrative example, a substrate (such as a first substrate 401) can be loaded into a first substrate pocket 411, and can be positioned in a first process position P1. A first tungsten deposition process that deposits a first tungsten layer 461 can be performed on a physically exposed surface of the substrate in the first process position by flowing the fluorine-containing tungsten precursor gas into the first process position in the vacuum enclosure 410 in a first tungsten deposition process. Generally, the first tungsten deposition process occurs while a substrate pocket (e.g., 411) holding a respective substrate (for example, the first substrate 401) on a pedestal is in the first process position. A first showerhead 421 configured to evenly distribute the fluorine-containing tungsten precursor gas can be provided over the first process position.

An optional first in-situ oxidation process can be performed after the first tungsten deposition process while the respective substrate 401 remains in the first process position P1. In one embodiment, the first oxidation step can remove residual fluorine atoms in the first tungsten layer 461 by exposing the first tungsten layer 461 to an oxidation agent gas while the respective remains within the tungsten deposition apparatus. The substrate 401 on which the first tungsten deposition process and the first in-situ oxidation process are performed may be stationary in the first process position P1, or may slowly move through the first process position, during the first tungsten deposition process and the first oxidation process. If desired, one or more lift pins may be used to lift the substrate 401 above the pedestal in the substrate pocket 411 during the oxidation process if a lower substrate temperature is desired during the oxidation process than during the tungsten deposition process. Alternatively, if the first tungsten deposition process is a tungsten nucleation process, then the first oxidation process may be omitted.

The substrate 401 in the first substrate pocket 411 can be positioned in a second process position P2 by movement of the first substrate pocket 411 which may be effected by rotation of the platen 415 (or by movement of the substrate by an indexer to a second substrate pocket in a stationary platen). A second tungsten deposition process that deposits a second tungsten layer 462 can be performed on a physically exposed surface of the substrate 401 in the first substrate pocket 411 in the second process position P2 by flowing the fluorine-containing tungsten precursor gas into the second process position P2 in the vacuum enclosure 410 in a second tungsten deposition process. Generally, the second tungsten deposition process occurs while a substrate pocket (e.g., 411) holding a respective substrate (for example, the first substrate 401) is in the second process position P2. A second showerhead 422 configured to evenly distribute the fluorine-containing tungsten precursor gas can be provided over the second process position P2.

Another substrate (such as a second substrate 402) may be loaded into a second substrate pocket 412 after movement of the first substrate pocket 411 into the second process position P2. The second substrate pocket 412 is positioned at the first process position P1 with a substrate 402 therein, and another first tungsten deposition process can be performed on the second substrate 402 located within the second substrate pocket 412 at the first process position P1 concurrently with the second tungsten deposition process that is performed in the second process position P2 on the first substrate 401 in the first substrate pocket 411.

Optionally, a second in-situ oxidation process can be performed after the second tungsten deposition process while the first substrate 401 remains in the second process position P2 and the second substrate 402 remains in the first process position P1. In one embodiment, the second oxidation process can remove residual fluorine atoms in the first tungsten layer 462 by exposing the second tungsten layer 462 to an oxidation agent gas while the first substrate 401 remains within the tungsten deposition apparatus. Alternatively, the oxidation process may only be performed on the second substrate 402 in the first substrate position P1 without performing the oxidation process on the first substrate 401, or the oxidation process may only be performed on the first substrate 401 in the second substrate position P2 without performing the oxidation process on the second substrate 402 if only the tungsten nucleation layer is deposited in the first deposition position P2.

The first substrate 401 on which the second tungsten deposition process and the second in-situ oxidation process are performed may be stationary in the second process position P2, or may slowly move through the second process position P2 during the second tungsten deposition process and the second oxidation process. Concurrently with the second oxidation process, the second substrate 402 located within the second substrate pocket 412 can be subjected to a first in-situ oxidation process.

The first substrate pocket 411 can move to a third process position P3, and the second substrate pocket 412 can move to the second process position P2. A third tungsten deposition process and a third oxidation process can be performed on the first substrate 401 located within the first substrate pocket 411, and a second tungsten deposition process and a second oxidation process can be performed on the second substrate 402 located within the second substrate pocket 412. At the same time, a third substrate 403 can be loaded into a third substrate pocket 413 and positioned in the first process position P1, and a first tungsten deposition process and a first oxidation process can be performed in the first process position P1.

Subsequently, the first substrate pocket 411 can move to a fourth process position P4, the second substrate pocket 412 can move to the third process position P3, and the third substrate pocket 413 can move to the second process position P2, and a fourth substrate pocket 414 containing a fourth substrate 404 can be positioned at the first process position P1. A fourth tungsten deposition process and a fourth oxidation process can be performed on the first substrate 401 located within the first substrate pocket 411, a third tungsten deposition process and a third oxidation process can be performed on the second substrate 402 located within the second substrate pocket 412, a second tungsten deposition process and a second oxidation process can be performed on the third substrate 413 located within the third substrate pocket 413, and a first tungsten deposition process and a first oxidation process can be performed on the fourth substrate 404 located within the fourth substrate pocket 414.

The first substrate pocket 411 can be subsequently moved to the first process position P1, and the first substrate 401 within the first substrate pocket 411 can be unloaded from the chamber 410. A new substrate can be loaded into the first substrate pocket 411. Other substrate pockets with a respective substrates therein move to a respective subsequent process position. A first tungsten deposition process and a first oxidation process can be performed in the first process position P1, a second tungsten deposition process and a second oxidation process can be performed in the second process position P2, a third tungsten deposition process and a third oxidation process can be performed in the third process position P3, and a fourth tungsten deposition process and a fourth oxidation process can be performed in the fourth process position P4.

Each substrate can move through the various process positions to sequentially receive each of the tungsten deposition processes and each of the oxidation processes that are used to form the various tungsten layers (461, 462, 463, 464). While the present disclosure is described employing an embodiment in which four tungsten deposition processes and four oxidation processes are employed, embodiments are expressly contemplated herein in which a different number of tungsten deposition processes and/or a different number of oxidation processes are employed. Further, the total number of oxidation processes may, or may not, be the same as the total number of tungsten deposition processes. For example, only one oxidation process may be carried out at the second or third process position.

Generally, the automated program can be configured to sequentially perform a set of processing steps that comprise a first tungsten deposition process that deposits a first tungsten layer 461 on a physically exposed surface of each of the at least one substrate (401, 402, 403, 404) by flowing the fluorine-containing tungsten precursor gas into the vacuum enclosure 410 in a first tungsten deposition process, an in-situ oxidation process by removing residual fluorine atoms in each first tungsten layer 461 by exposing each first tungsten layer 461 to an oxidation agent gas while the at least one substrate (401, 402, 403, 404) remains within the tungsten deposition apparatus, and a second tungsten deposition process that deposits a second tungsten layer 462 on each first tungsten layer by flowing the fluorine-containing tungsten precursor gas into the vacuum enclosure 410 in a second tungsten deposition process after the in-situ oxidation process.

In one embodiment, the process chamber comprises a plurality of showerheads (421, 422, 423, 424) overlying a respective one of the plurality of substrate pockets (411, 412, 413, 414), and the automated program can be configured to perform the in-situ oxidation process by flowing the oxidation agent gas through at least one of the plurality of showerheads (421, 422, 423, 424) into the process chamber 410.

In one embodiment, the automated program can be configured to induce rotation of the plurality of substrate pockets (411, 412, 413, 414) around a vertical axis passing through a geometrical center of an entire volume of the process chamber 410 while holding the plurality of substrates (401, 402, 403, 404) and while performing at least one of the first tungsten deposition process, the in-situ oxidation process, and the second tungsten deposition process.

Figure 11:
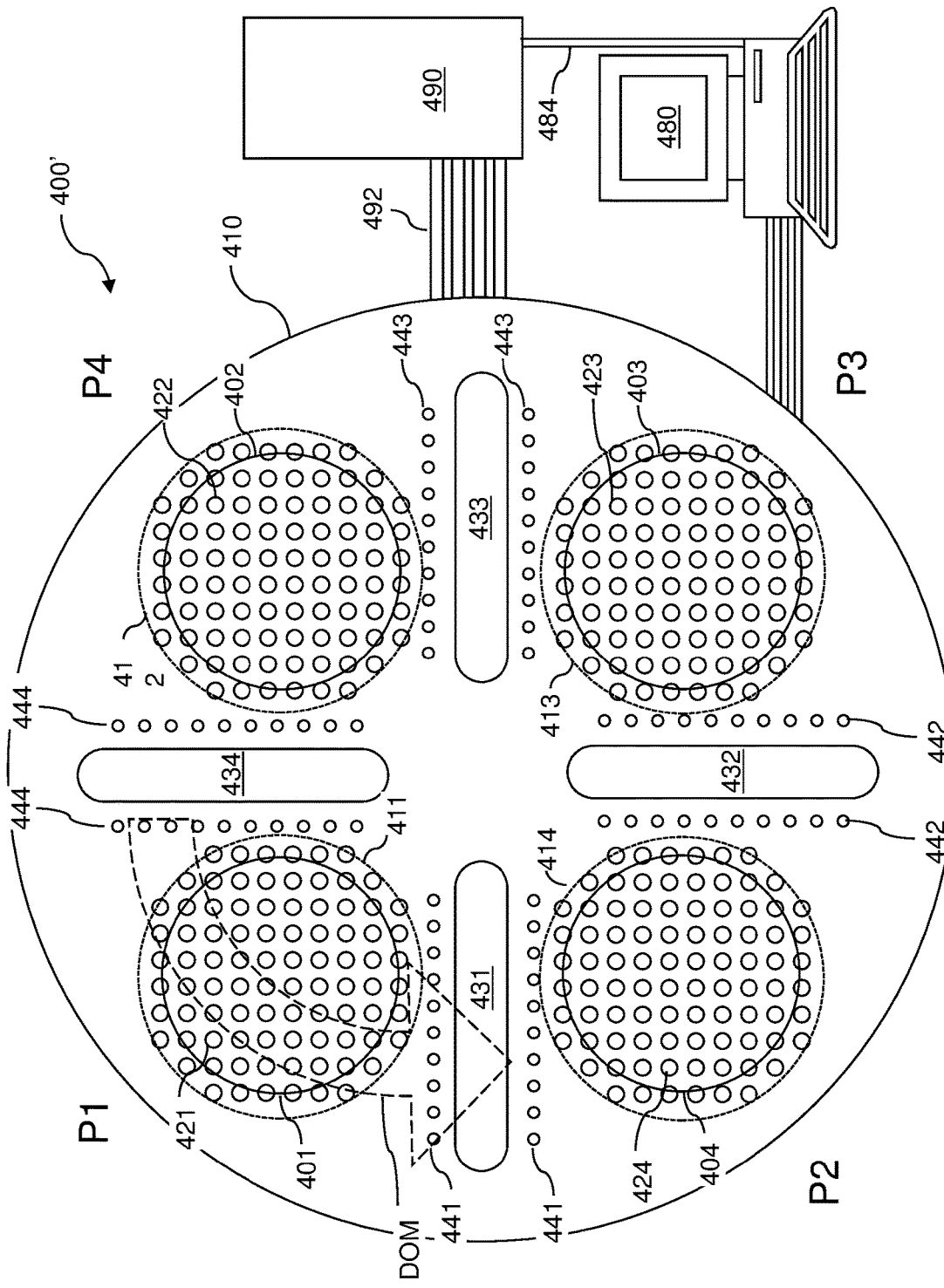
FIG. 11 is a schematic view of a second tungsten deposition apparatus according to a second embodiment of the present disclosure.

Referring to FIG. 11, a second tungsten deposition apparatus 400' according to a second embodiment of the present disclosure is illustrated. The second tungsten deposition apparatus 400' can be derived from the first tungsten deposition apparatus 400 illustrated in FIG. 10 by providing oxidation regions (441, 442, 443, 444). For example, a first oxidation region 441 can be provided between the first process position P1 and the second process position P2, a second oxidation region 442 can be provided between the second process position and the third process position P2, a third oxidation region 443 can be provided between the third process position and the fourth process position P4, and a fourth oxidation region 444 can be provided between the fourth process position and the first process position.

In one embodiment, each oxidation region may comprise one or more gas nozzles or showerheads that are configured to provide a gas to the respective oxidation region. For example, the gas nozzles may be used to provide an inert gas curtain (e.g., argon curtain) between the adjacent process positions during the tungsten deposition steps, and then to provide a combination of the inert gas curtain (e.g., argon curtain) and oxidizing agent gas during the indexing of the substrate pockets (411, 412, 413, 414) around the vertical axis when the substrates are moved from one process position to the subsequent process position. Thus, the oxidation step may be performed during the indexing step. While a linear arrangement of gas nozzles or showerheads is shown in FIG. 11, it should be understood that other arrangements may be used. For example, the gas nozzles may be arranged in a circle around the location of a substrate pocket at each process position to provide an inert gas curtain around the entire substrate pocket during tungsten deposition.

In this case, an optional first in-situ oxidation process can be performed as the respective substrate 401 passes through the first oxidation region 441, a second in-situ oxidation process can be performed as the respective substrate 401 passes through the second oxidation region 442, a third in-situ oxidation process can be performed as the respective substrate 401 passes through the third oxidation region 443, and a fourth in-situ oxidation process can be performed as the respective substrate 401 passes through the fourth oxidation region 444. Residual fluorine atoms in the physically exposed tungsten layer (461, 462, 463, 464) are removed by exposing the respective tungsten layer to an oxidation agent gas while each substrate remains within the tungsten deposition apparatus.

While a single direction of movement DOM is shown in FIG. 11, in an alternative embodiment, the substrate pockets may be rocked back and forth (e.g., moved clockwise and counter-clockwise) during the combined substrate indexing and oxidation step. Furthermore, only one oxidation region (e.g., region 443) may be located in the process chamber 410 if only one oxidation step is desired.

In one embodiment, the process chamber may comprise a plurality of showerheads (421, 422, 423, 424) overlying a respective one of the plurality of substrate pockets (411, 412, 413, 414) in each of the process positions (P1, P2, P3, P4), and the automated program can be configured to induce movement of the plurality of substrate pockets and to perform the in-situ oxidation process while the plurality of substrate pockets (411, 412, 413, 414) rotate in one or two directions underneath a respective oxidation region (441, 442, 443, 444) while holding the plurality of substrates (401, 402, 403, 404) therein. In one embodiment, the plurality of showerheads (421, 422, 423, 424) and the oxidation regions (441, 442, 443, 444) can alternate along an azimuthal direction around a vertical axis passing through a geometrical center of an entire volume of the vacuum enclosure 410, which may be the same as the entire volume of the process chamber.

In one embodiment, the process chamber comprises a plurality of pumping ports (431, 432, 433, 434) located in proximity to the oxidation regions (441, 442, 443, 444), and the plurality of substrate pockets can be configured to partially block the plurality of pumping ports (431, 432, 433, 434) during transit over the plurality of pumping ports (431, 432, 433, 434). The total pressure of the process chamber increases from a base pressure to a reduced pressure in a range from 0.01 mTorr to 1 Torr during the in-situ oxidation process, thereby facilitating the oxidation process.

Figure 12:
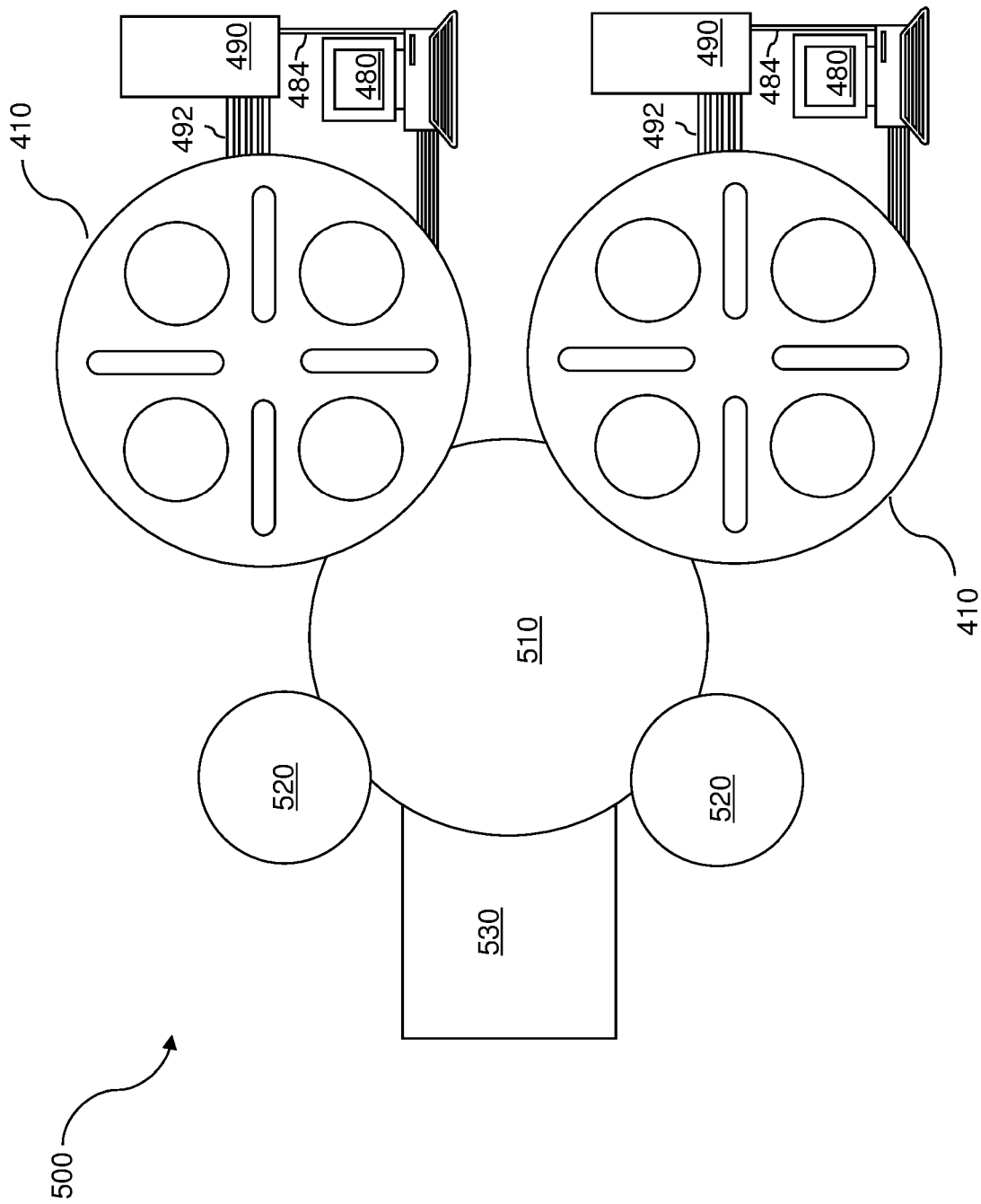
FIG. 12 is a schematic view of a third tungsten deposition apparatus according to a third embodiment of the present disclosure.

Referring to FIG. 12, a third tungsten deposition apparatus 500 according to a third embodiment of the present disclosure is a multi-chamber apparatus which can include plural process chambers 410 of the first tungsten deposition apparatus 400. The third tungsten deposition apparatus 500 can include at least one oxidation chamber 520 that is connected to each process chamber 410 through a transfer region (which may comprise a transfer chamber 510 including at least one robotic arm) that is under vacuum. A loadlock 530 may be attached to the transfer region to facilitate loading and unloading of substrates into, or out of, the transfer region. In one embodiment, the automated program can be configured to transfer each of the at least one substrate into an oxidation chamber 520, and to perform the in-situ oxidation process by flowing the oxidation agent gas into the oxidation chamber 520. In some embodiments, a plurality of process chambers 410, and/or a plurality of oxidation chambers 520, may be attached to a common transfer region 510. The in-situ oxidation process is performed after transferring each of the at least one substrate into the oxidation chamber 520 and flowing the oxidation agent gas into the oxidation chamber 520 without any of the substrates exiting vacuum environment provided by the third tungsten deposition apparatus 500.

In this embodiment, only tungsten layers (461, 462, 463, 464) are deposited in the process chambers 410. Upon reaching a process position in which the oxidation process is performed, the respective substrate is removed from the process chamber 410 into the transfer region 510 under vacuum and then provided from the transfer region 510 into the oxidation chamber 520 under vacuum. The oxidation process is performed in the oxidation chamber 520, followed by removing the substrate from the oxidation chamber into the transfer region 510 under vacuum and providing the substrate back into the process chamber 410 to deposit the next tungsten layer. In one embodiment, there may be the same number (e.g., two or more) of process chambers 410 and oxidation chambers 520. In another embodiment, there may be a different number of process chambers 410 (e.g., two process chambers 410) and oxidation chambers 520 (e.g., one oxidation chamber).

Figure 13:
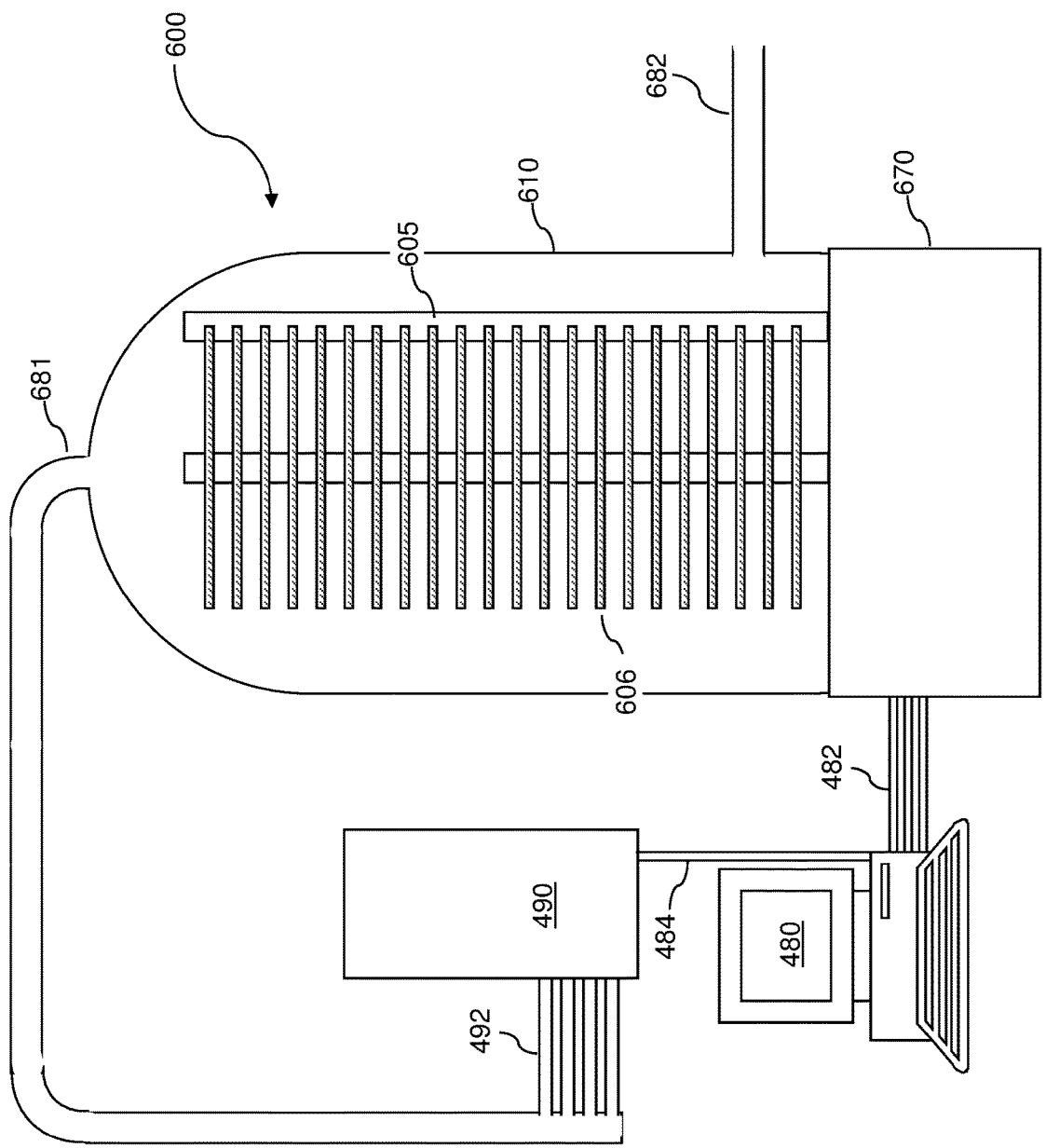
FIG. 13 is a schematic view of a fourth tungsten deposition apparatus according to a fourth embodiment of the present disclosure.

Referring to FIG. 13, a fourth tungsten deposition apparatus 600 according to a fourth embodiment of the present disclosure can comprise a CVD apparatus. The apparatus 600 includes a vacuum enclosure 610 such as a furnace tube, and a pedestal 670 configured to seal a confined volume under vacuum in combination with the vacuum enclosure 610. A gas inlet 681 and a gas outlet 682 may be provided in the vacuum enclosure 610. Generally, the vacuum enclosure contains a slotted rail assembly 605 therein. The automated program is configured to load a plurality of substrates 606 into slots within the slotted rail assembly 605. Further, the automated program can be configured to perform sequentially perform an alternating sequence of at least two tungsten deposition processes and at least one in-situ oxidation process by alternately flowing the fluorine-containing tungsten precursor gas and the oxidation agent gas into the vacuum enclosure.

Referring generally to FIGS. 9D-9G and 10-13, a method of depositing tungsten over a substrate includes disposing the substrate 401 into a vacuum enclosure (410, 520) of a tungsten deposition apparatus (400, 400', 500, 600), performing a first tungsten deposition process that deposits a first tungsten layer 461 over a physically exposed surface of the substrate (9, 10) by flowing a fluorine-containing tungsten precursor gas into the vacuum enclosure 410, performing an in-situ oxidation process by exposing the first tungsten layer to an oxidation agent gas while the substrate remains within the vacuum enclosure (410, 520) without breaking vacuum and forming a tungsten oxyfluoride gas which is pumped out of the vacuum enclosure; and performing a second tungsten deposition process that deposits a second tungsten layer 462 on the first tungsten layer 461 by flowing the fluorine-containing tungsten precursor gas into the vacuum enclosure 410 in a second tungsten deposition process after the in-situ oxidation process.

In the embodiment of FIGS. 10 and 11, the vacuum enclosure comprises a process chamber 410 containing a plurality of substrate pockets (411, 412, 413, 414), a plurality of substrates (401, 402, 403, 404) are loaded into a respective one of the plurality of substrate pockets, the first tungsten deposition process is performed at a first process location P1 in the process chamber 410, and the second tungsten deposition is performed at a second process location P2 in the process chamber 410.

In the embodiment of FIG. 10, the process chamber 410 comprises a first showerhead 421 overlying the first process position P1 and a second showerhead 422 overlying a second process position P2. The first tungsten deposition process is performed when the substrate 401 located in a first substrate pocket 411 of the plurality of substrate pockets is located in the first process position p1 and the fluorine-containing tungsten precursor gas is flowed through the first showerhead 421. The in-situ oxidation process is performed by flowing the oxidation agent gas through the first showerhead 421 while the substrate 401 located in the first substrate pocket 411 is located in the first process position P1. The second tungsten deposition process is performed when the substrate 401 located in the first substrate pocket 411 is located in the second process position P2 and the fluorine-containing tungsten precursor gas is flowed through the second showerhead 422.

In one embodiment, the method of further comprises lifting the substrate 401 above a pedestal of the first substrate pocket 411 during the in-situ oxidation process, and lowering the substrate 401 onto the pedestal of the first substrate pocket 411 during the second tungsten deposition process.

In the embodiment of FIG. 11, the process chamber 410 comprises a first showerhead 421 overlying the first process position P1, a second showerhead 422 overlying a second process position P2, and an oxidation region 441 located between the first process position P1 and the second process position P2. The first tungsten deposition process is performed when the substrate 401 located in a first substrate pocket 411 of the plurality of substrate pockets is located in the first process position P1 and the fluorine-containing tungsten precursor gas is flowed through the first showerhead 421. The in-situ oxidation process is performed by flowing the oxidation agent gas into the oxidation region 441 while the substrate 401 located in the first substrate pocket 411 is moving from the first process position P1 to the second process position P2. The second tungsten deposition process is performed when the substrate 401 located in the first substrate pocket 411 is located in the second process position P2 and the fluorine-containing tungsten precursor gas is flowed through the second showerhead 422.

In one embodiment, the process chamber 410 comprises a plurality of showerheads (421, 422, 423, 424) and a plurality of oxidation regions (441, 442, 443, 444) which alternate along an azimuthal direction around a vertical axis passing through a geometrical center of an entire volume of the process chamber 410.

In one embodiment, the method further comprises rotating the plurality of substrate pockets (411, 412, 413, 414) around the vertical axis in one or two directions while performing the in-situ oxidation process.

In the embodiment of FIG. 12, the vacuum enclosure comprises an oxidation chamber 520 that is connected to a process chamber 410 through a transfer region 510 that is under vacuum. The in-situ oxidation process is performed after transferring the substrate 401 from the process chamber 410 in which the first tungsten layer 461 is deposited, into the oxidation chamber 520 and flowing the oxidation agent gas into the oxidation chamber 520.

In one embodiment, performing the in-situ oxidation process comprises exposing the first tungsten layer 461 to the oxidation agent gas to form a tungsten oxyfluoride layer on the first tungsten layer 461, preheating the substrate to at least 110 degrees Celsius to sublimate the tungsten oxyfluoride layer to a tungsten oxyfluoride gas; and pumping the tungsten oxyfluoride gas out of the vacuum enclosure (410, 520).

In one embodiment, the tungsten-containing precursor gas can comprise tungsten hexafluoride, and each of the tungsten deposition processes can comprise a respective thermal chemical vapor deposition or atomic layer deposition process that is performed at an elevated temperature in a range from 380 degrees Celsius to 480 degrees Celsius, such as 430 degrees Celsius to 450 degrees Celsius. Generally, each tungsten deposition apparatus (400, 400', 500, 600) can be configured to deposit substantially fluorine-free tungsten films simultaneously on at least one substrate, such as one or a plurality of substrates. In some embodiments, each of the at least one substrate comprises a semiconductor substrate including a vertically alternating stack of insulating layers 32 and laterally-extending cavities 43 thereupon. The insulating layers 32 can be supported by vertically-extending structures (58, 20) that extend through each of the insulating layers 32 within the vertically alternating stack (32, 43).

In one embodiment, each tungsten deposition apparatus (400, 400', 500, 600) can be operated such that the automated program that sequentially perform a set of processing steps that includes at least a first tungsten deposition process that deposits a first tungsten layer 461 on a physically exposed surface of each of the at least one substrate by flowing the fluorine-containing tungsten precursor gas into the vacuum enclosure in a first tungsten deposition process, an in-situ oxidation process that exposes the first tungsten layer to an oxidation agent gas while the at least one substrate remains within the vacuum enclosure without breaking vacuum and forms a tungsten oxyfluoride gas which is pumped out of the vacuum enclosure; and a second tungsten deposition process that deposits a second tungsten layer 462 on each first tungsten layer by flowing the fluorine-containing tungsten precursor gas into the vacuum enclosure in a second tungsten deposition process after the in-situ oxidation process. The first tungsten layer 461 and the second tungsten layer 462 can be deposited within volumes of the laterally-extending cavities 43. At least one additional oxidation process and/or at least one additional tungsten deposition process may be performed as needed.

In one embodiment, the vertically-extending structures (58, 20) comprise memory opening fill structures 58 each including a respective vertical semiconductor channel 60 and a respective memory film 50. In one embodiment, each of the laterally-extending cavities 43 are partly filled with the first tungsten layer 461 after the first tungsten deposition process, and the tungsten oxyfluoride gas which is pumped out of the vacuum enclosure through remaining unfilled volumes of the laterally-extending cavities 43 during the in-situ oxidation process and/or optionally during a subsequent thermal preheating step during which a solid tungsten oxyfluoride layer sublimates and is pumped out of the vacuum enclosure.

Figure 14A:
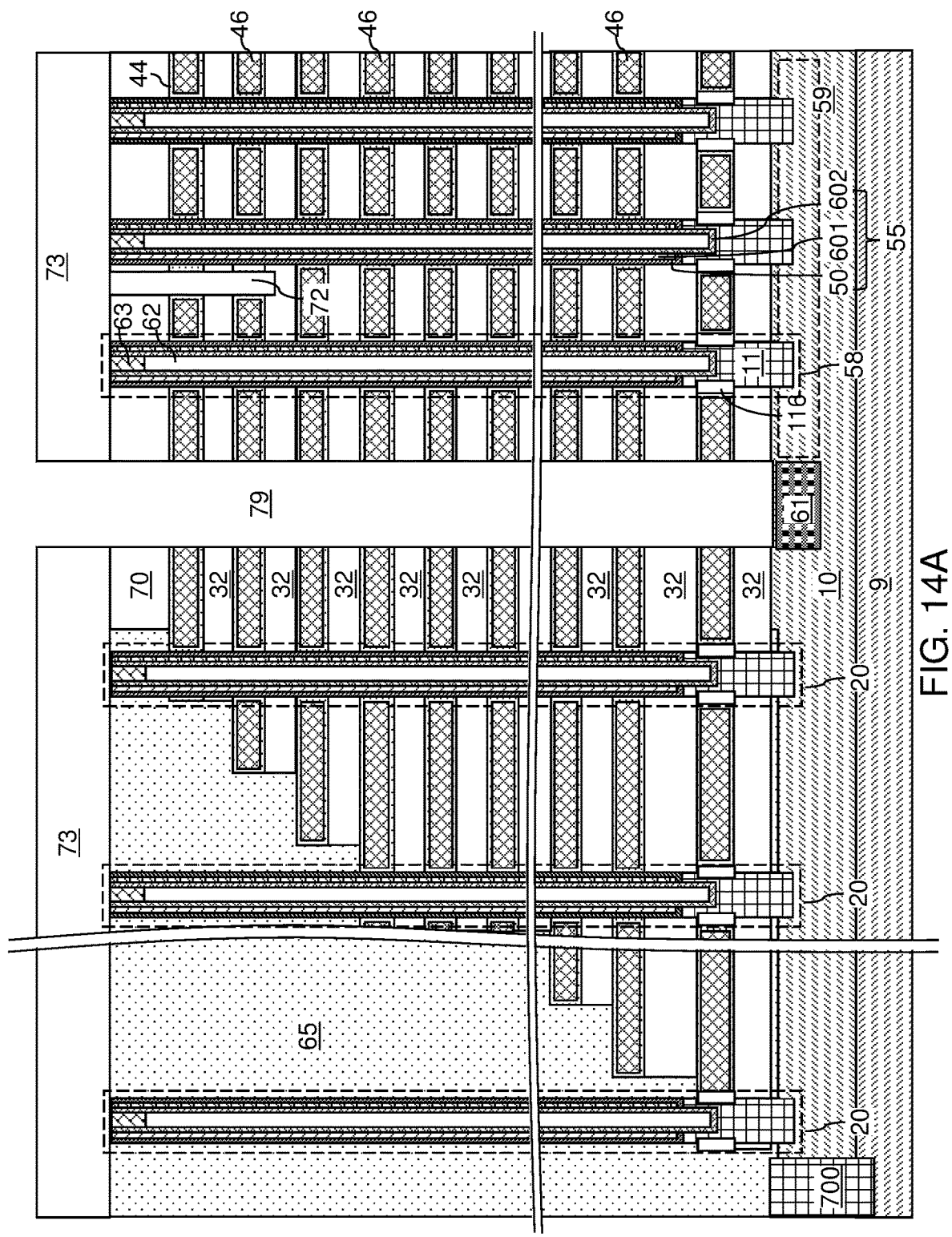
FIG. 14A is a schematic vertical cross-sectional view of the exemplary semiconductor structure after removal of a deposited conductive material from within the backside trenches according to an embodiment of the present disclosure.
Figure 14B:
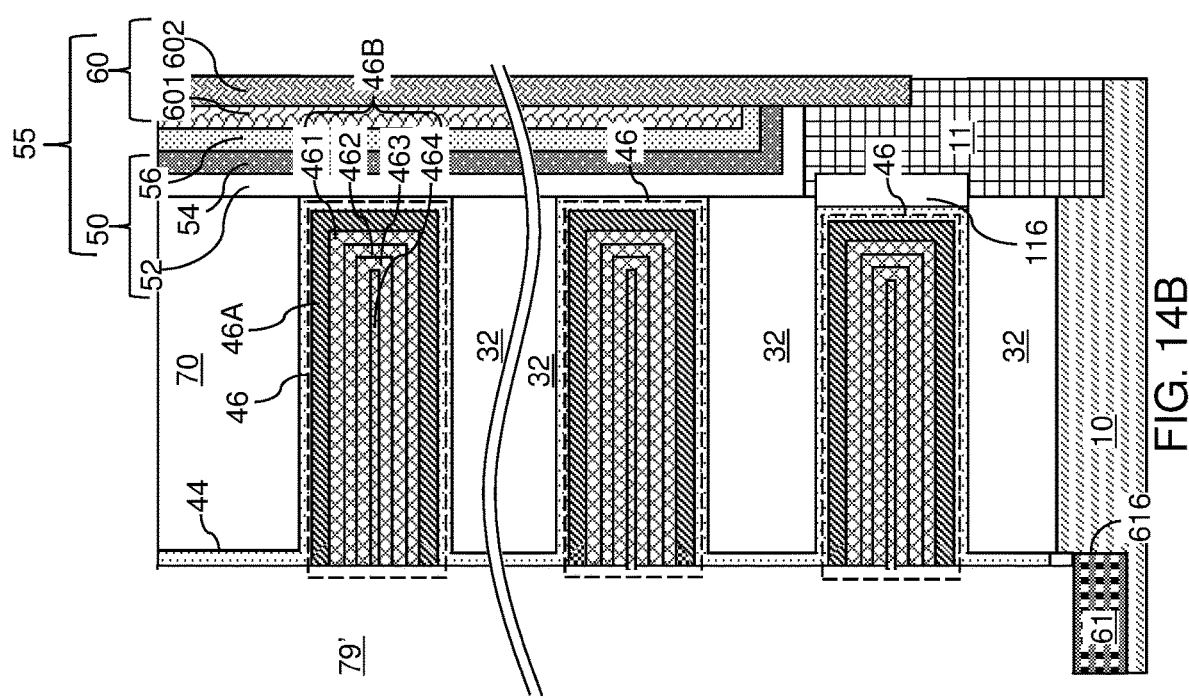
FIG. 14B is a magnified view of a region in FIG. 14A.

Referring to FIGS. 14A and 14B, additional processing steps may be performed on the exemplary structure to form a three-dimensional array of memory elements. For example, the portions of the tungsten layers (461, 462, 463, 464) and the metallic barrier layer 46A located within the backside trenches 79 or above the contact-level dielectric layer 73 can be etched back, for example, by an isotropic wet etch, an anisotropic dry etch, or a combination thereof. Each remaining portion of the deposited metallic material in the laterally-extending cavities 43 constitutes an electrically conductive layer 46. Each electrically conductive layer 46 can be a conductive line structure. Thus, the sacrificial material layers 42 are replaced with the electrically conductive layers 46. A backside cavity 79' is present within each backside trench 79.

Figure 15A:
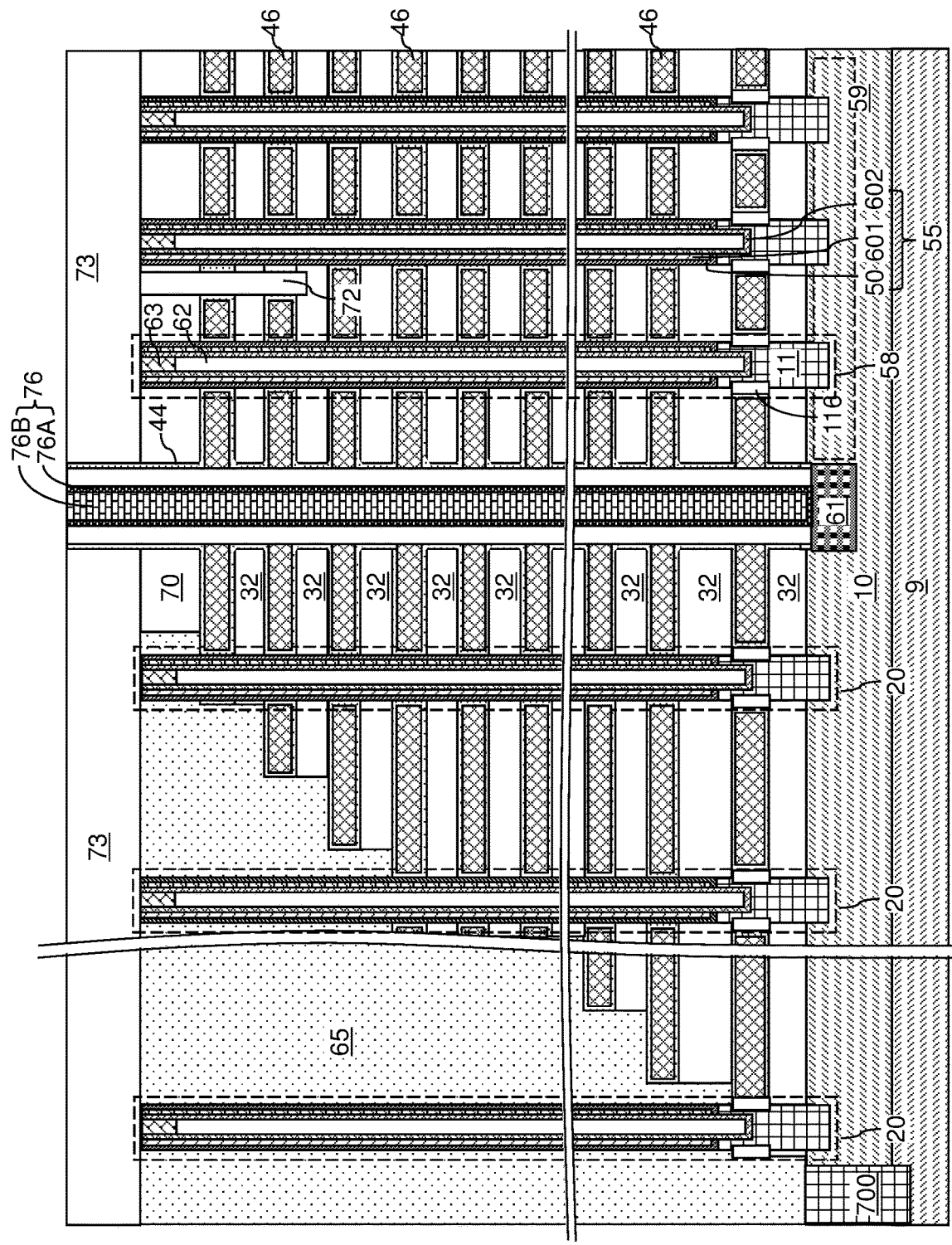
FIG. 15A is a schematic vertical cross-sectional view of the exemplary semiconductor structure after formation of an insulating spacer and a backside contact structure in each backside trench according to an embodiment of the present disclosure.

Referring to FIGS. 15A and 15B, an insulating material layer (e.g., silicon oxide) can be formed in the backside trenches 79 and over the contact level dielectric layer 73 by a conformal deposition process. An anisotropic etch is performed to remove horizontal portions of the insulating material layer from above the contact level dielectric layer 73 and at the bottom of each backside trench 79. Each remaining portion of the insulating material layer constitutes an insulating spacer 74. A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The at least one conductive material can be planarized employing the contact level dielectric layer 73 overlying the alternating stack (32, 46) as a stopping layer. Each remaining continuous portion of the at least one conductive material in the backside trenches 79 constitutes a backside contact via structure 76.

Alternatively, at least one dielectric material, such as silicon oxide, may be conformally deposited in the backside trenches 79 by a conformal deposition process. Each portion of the deposited dielectric material that fills a backside trench 79 constitutes a backside trench fill structure. In this case, each backside trench fill structure may fill the entire volume of a backside trench 79 and may consist essentially of at least one dielectric material. In this alternative embodiment, the source region 61 may be omitted, and a horizontal source line (e.g., direct strap contact) may contact an side of the lower portion of the semiconductor channel 60.

Figure 16A:
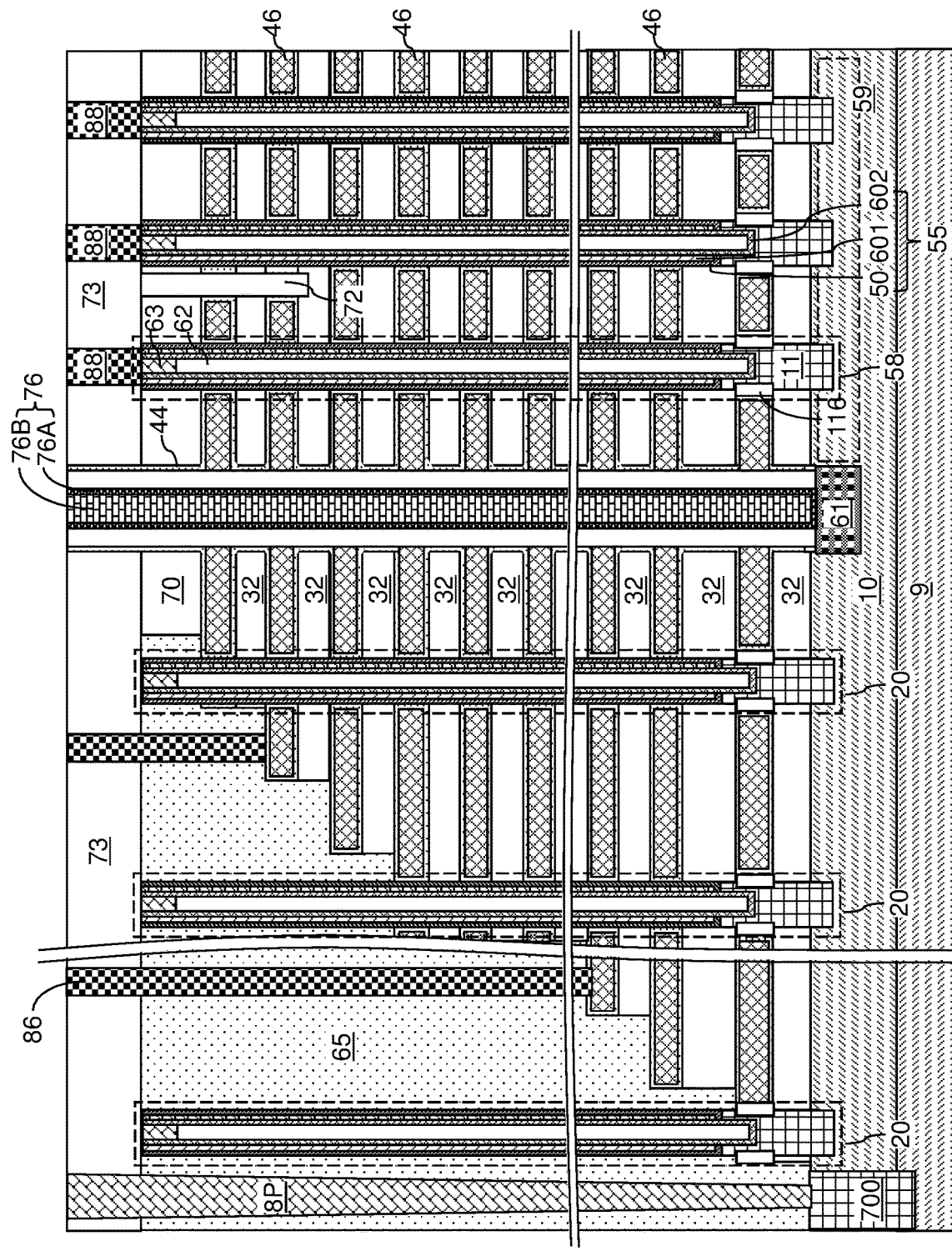
FIG. 16A is a schematic vertical cross-sectional view of the exemplary semiconductor structure after formation of additional contact via structures according to an embodiment of the present disclosure.
Figure 16B:
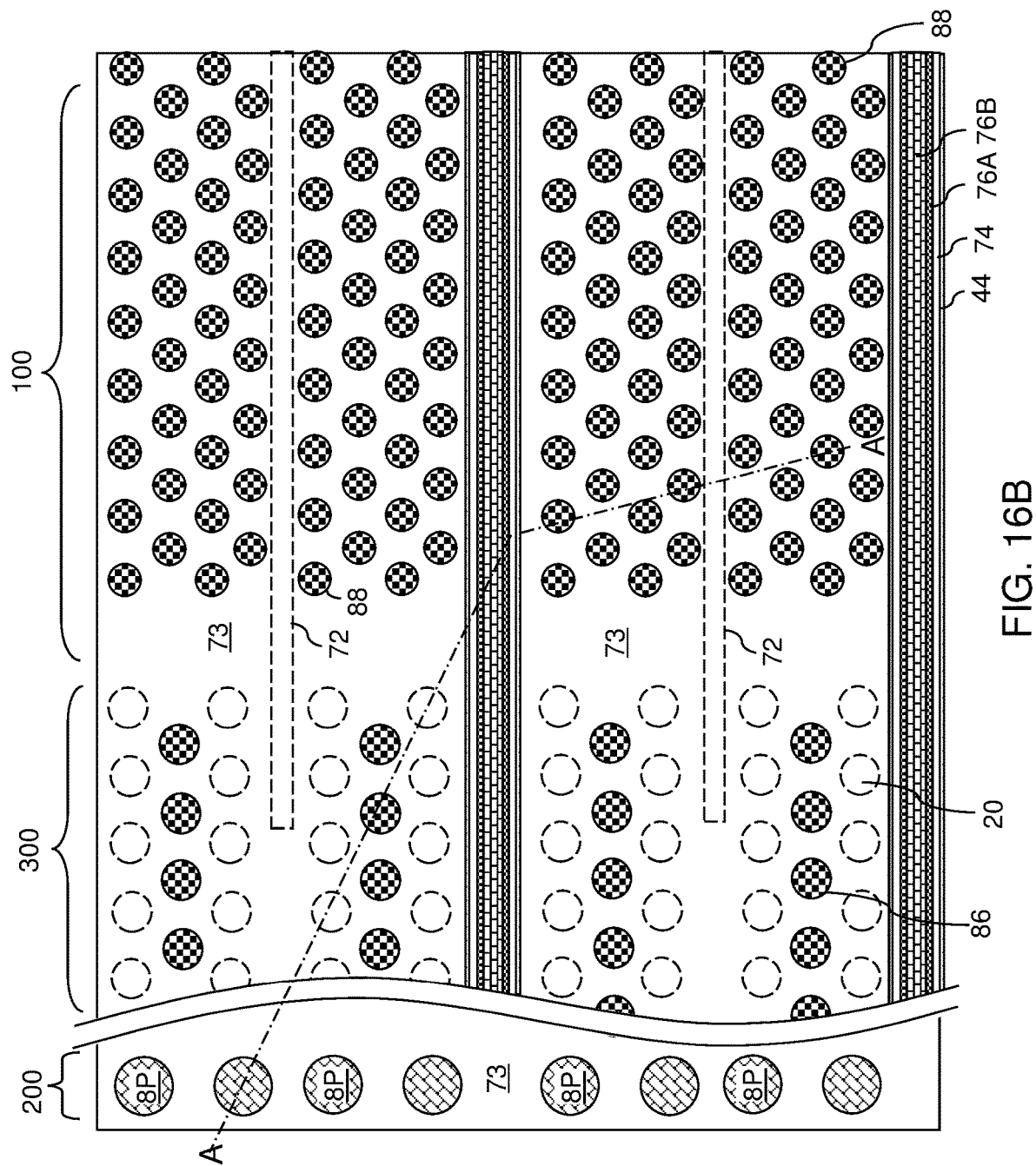
FIG. 16B is a top-down view of the exemplary semiconductor structure of FIG. 16A. The vertical plane A-A' is the plane of the schematic vertical cross-sectional view of FIG. 16A.

Referring to FIGS. 16A and 16B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices. Bit lines (not shown) are then formed over and in electrical contact with the drain contact via structures 88.

The various embodiments of the present disclosure provide methods for depositing a substantially fluorine-free tungsten layer by repetition of a tungsten deposition process and an in-situ oxidation process that is performed without breaking vacuum on the substrate with a tungsten layer, i.e., without causing the substrate to exit the tungsten deposition apparatus and without exposing each first tungsten layer to an atmospheric ambient. By avoiding exposure to air or any other atmospheric ambient, the process throughput is increased and contamination of tungsten by particles or other contaminants outside of the tungsten deposition apparatus can be prevented. Further, a plurality of substrates can be simultaneously processed in a tungsten deposition apparatus, thereby increasing the throughput of the tungsten deposition apparatus.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of depositing tungsten over a substrate, comprising:
    disposing the substrate into a vacuum enclosure of a tungsten deposition apparatus;
    performing a first tungsten deposition process that deposits a first tungsten layer on a physically exposed surface of the substrate by forming a vacuum and flowing a fluorine-containing tungsten precursor gas into the vacuum enclosure;
    performing an in-situ oxidation process by exposing the first tungsten layer to an oxidation agent gas while the substrate remains within the vacuum enclosure without breaking the vacuum and forming a tungsten oxyfluoride gas which is pumped out of the vacuum enclosure; and
    performing a second tungsten deposition process that deposits a second tungsten layer on the first tungsten layer by flowing the fluorine-containing tungsten precursor gas into the vacuum enclosure in the second tungsten deposition process after the in-situ oxidation process.

2. The method of claim 1, wherein:
    the vacuum enclosure comprises a process chamber containing a plurality of substrate pockets;
    a plurality of substrates including the substrate are loaded into the plurality of substrate pockets;
    the first tungsten deposition process is performed at a first process position in the process chamber; and
    the second tungsten deposition process is performed at a second process position in the process chamber.

3. The method of claim 2, wherein:
    the process chamber comprises a first showerhead overlying the first process position and a second showerhead overlying the second process position;
    the first tungsten deposition process is performed when the substrate located in a first substrate pocket of the plurality of substrate pockets is located in the first process position and the fluorine-containing tungsten precursor gas is flowed through the first showerhead;
    the in-situ oxidation process is performed by flowing the oxidation agent gas through the first showerhead while the substrate located in the first substrate pocket is located in the first process position; and
    the second tungsten deposition process is performed when the substrate located in the first substrate pocket is located in the second process position and the fluorine-containing tungsten precursor gas is flowed through the second showerhead.

4. The method of claim 3, further comprising lifting the substrate above a pedestal of the first substrate pocket during the in-situ oxidation process, and lowering the substrate onto the pedestal of the first substrate pocket during the second tungsten deposition process.

5. The method of claim 2, wherein:
    the process chamber comprises a first showerhead overlying the first process position, a second showerhead overlying the second process position, and an oxidation region located between the first process position and the second process position;
    the first tungsten deposition process is performed when the substrate located in a first substrate pocket of the plurality of substrate pockets is located in the first process position and the fluorine-containing tungsten precursor gas is flowed through the first showerhead;

the in-situ oxidation process is performed by flowing the oxidation agent gas into the oxidation region while the substrate located in the first substrate pocket is moving from the first process position to the second process position; and the second tungsten deposition process is performed when the substrate located in the first substrate pocket is located in the second process position and the fluorine-containing tungsten precursor gas is flowed through the second showerhead.

6. The method of claim 5, wherein the process chamber comprises a plurality of showerheads and a plurality of oxidation regions which alternate along an azimuthal direction around a vertical axis passing through a geometrical center of an entire volume of the process chamber.

7. The method of claim 6, further comprising rotating the plurality of substrate pockets around the vertical axis in one or two directions while performing the in-situ oxidation process.

8. The method of claim 1, wherein:

the vacuum enclosure comprises an oxidation chamber that is connected to a process chamber through a transfer region that is under vacuum; and the in-situ oxidation process is performed after transferring the substrate from the process chamber in which the first tungsten layer is deposited into the oxidation chamber and flowing the oxidation agent gas into the oxidation chamber.

9. The method of claim 1, wherein performing the in-situ oxidation process comprises:

exposing the first tungsten layer to the oxidation agent gas to form a tungsten oxyfluoride layer on the first tungsten layer;

preheating the substrate to at least 110 degrees Celsius to sublimate the tungsten oxyfluoride layer to the tungsten oxyfluoride gas; and pumping the tungsten oxyfluoride gas out of the vacuum enclosure.

10. The method of claim 1, wherein:

the tungsten-containing precursor gas comprises tungsten hexafluoride; and each of the first tungsten deposition process and the second tungsten deposition process comprise a respective thermal chemical vapor deposition or atomic layer deposition process that is performed at an elevated temperature in a range from 380 degrees Celsius to 480 degrees Celsius.

11. The method of claim 1, wherein:

the substrate comprises a semiconductor substrate including a vertically alternating stack of insulating layers and laterally-extending cavities thereupon, wherein the insulating layers are supported by vertically-extending structures that extend through each of the insulating layers within the vertically alternating stack; and the first tungsten layer and the second tungsten layer are deposited within volumes of the laterally-extending cavities.

12. The method of claim 11, wherein the vertically-extending structures comprise memory opening fill structures each including a respective vertical semiconductor channel and a respective memory film.

13. The method of claim 11, wherein:

each of the laterally-extending cavities are partly filled with the first tungsten layer after the first tungsten deposition process; and the tungsten oxyfluoride gas which is pumped out of the vacuum enclosure through remaining unfilled volumes of the laterally-extending cavities.

* * * * *